(12) United States Patent
Maruyama

(10) Patent No.: US 10,559,628 B2
(45) Date of Patent: Feb. 11, 2020

(54) SOLID-STATE IMAGE SENSOR, METHOD OF PRODUCING THE SAME, AND ELECTRONIC APPARATUS

(71) Applicant: Sony Semiconductor Solutions Corporation, Kanagawa (JP)

(72) Inventor: Shunsuke Maruyama, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 15/990,192

(22) Filed: May 25, 2018

(65) Prior Publication Data

US 2018/0277605 A1 Sep. 27, 2018

Related U.S. Application Data

(63) Continuation of application No. 15/345,967, filed on Nov. 8, 2016, now Pat. No. 10,002,909, which is a continuation of application No. 14/570,765, filed on Dec. 15, 2014, now Pat. No. 9,515,115.

(30) Foreign Application Priority Data

Dec. 20, 2013 (JP) .................................. 2013-263632

(51) Int. Cl.
*H01L 27/146* (2006.01)
*H01L 27/30* (2006.01)

(52) U.S. Cl.
CPC ...... *H01L 27/307* (2013.01); *H01L 27/14621* (2013.01); *H01L 27/14623* (2013.01); *H01L 27/14627* (2013.01); *H01L 27/14632* (2013.01); *H01L 27/14634* (2013.01); *H01L 27/14636* (2013.01); *H01L 27/14643* (2013.01); *H01L 27/14667* (2013.01); *H01L 27/14687* (2013.01)

(58) Field of Classification Search
CPC ......... H01L 27/14603; H01L 27/14605; H01L 27/14607; H01L 27/14609; H01L 27/14643
See application file for complete search history.

(56) References Cited

U.S. PATENT DOCUMENTS

2010/0238334 A1* 9/2010 Takahashi ......... H01L 27/14632 348/305

* cited by examiner

Primary Examiner — Jae Lee
(74) Attorney, Agent, or Firm — Sheridan Ross P.C.

(57) ABSTRACT

A solid-state image sensor includes a pixel formed, upon forming a structure where a photoelectric conversion layer is laminated on a wiring layer constituting a pixel circuit, by forming at least the photoelectric conversion layer and a wiring layer bonding layer on a different substrate from a semiconductor substrate in which the wiring layer is formed, and by bonding the wiring layer bonding film of the different substrate and the wiring layer of the semiconductor substrate together.

18 Claims, 27 Drawing Sheets

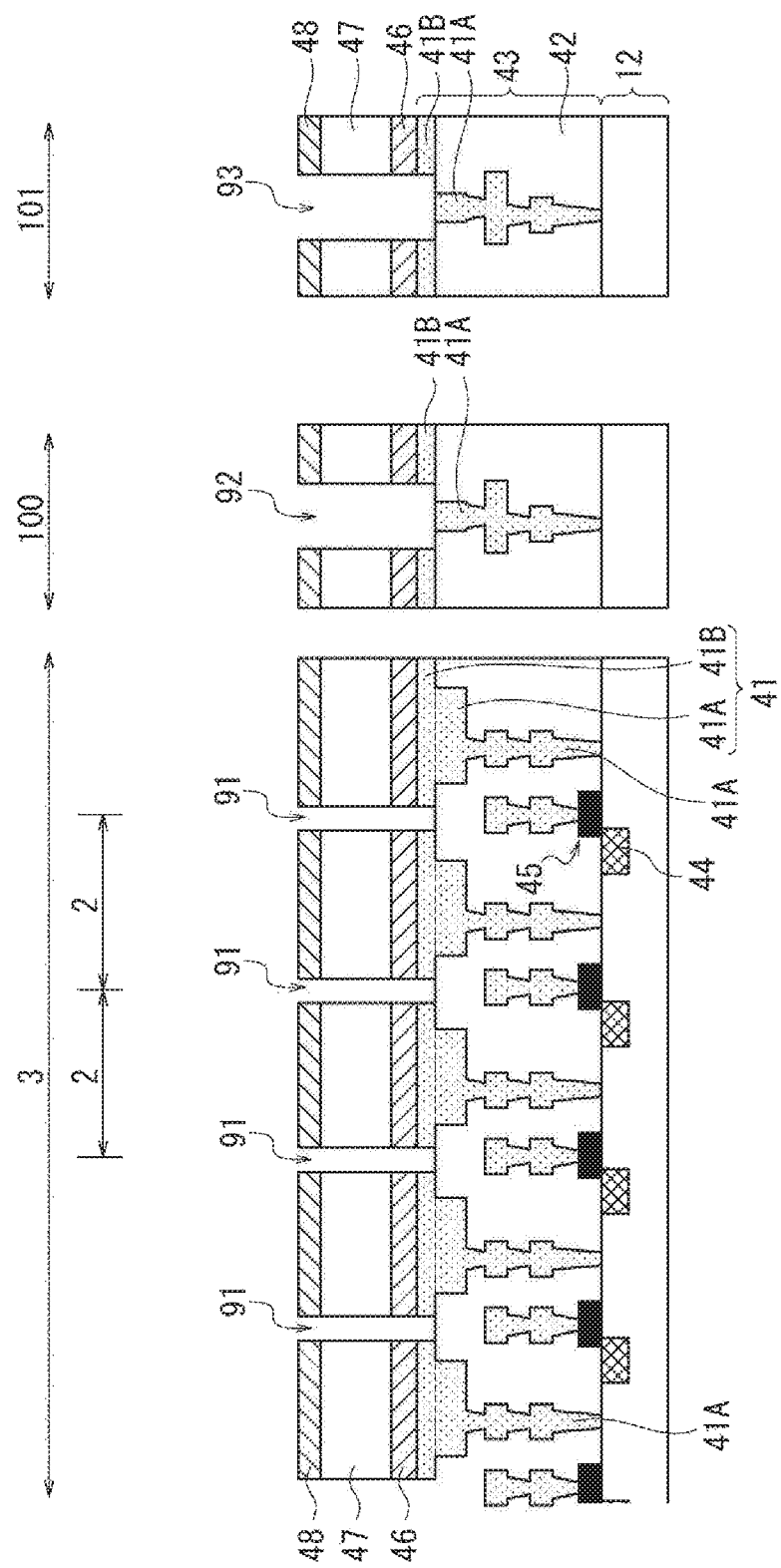

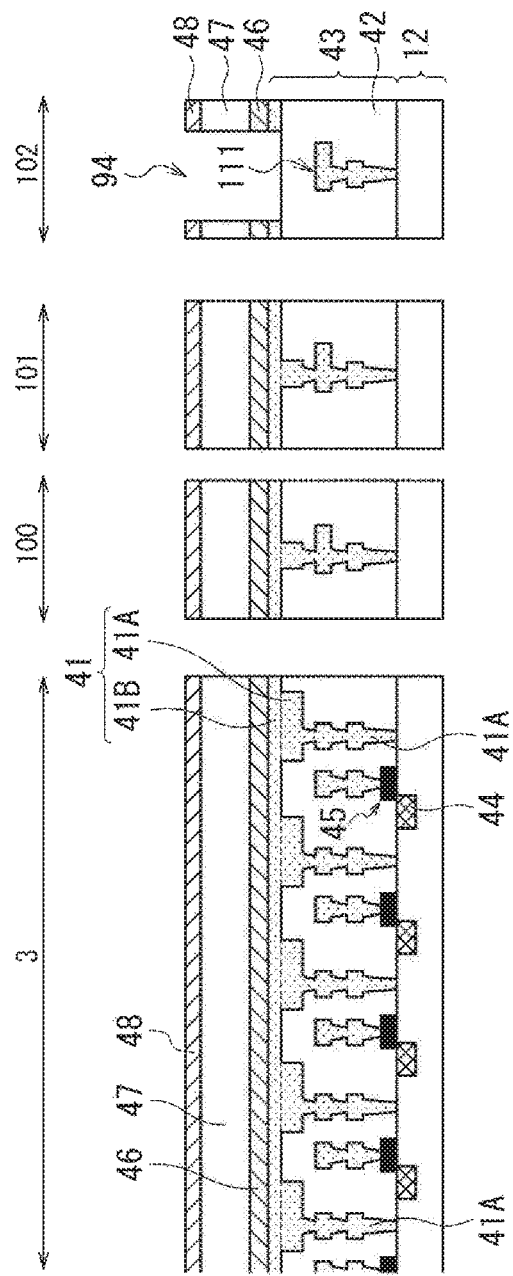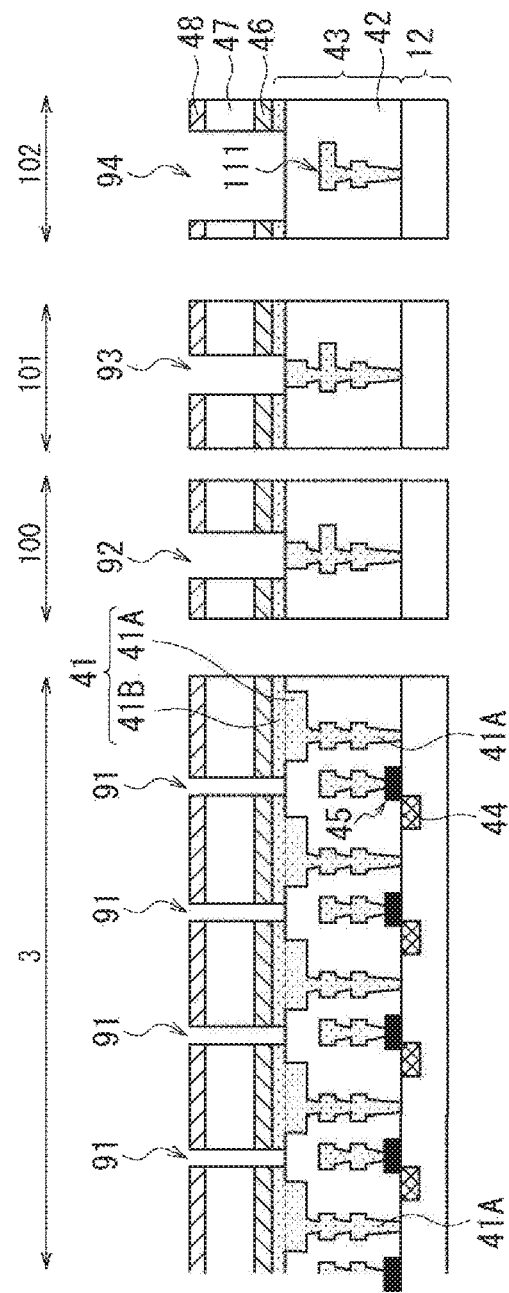

SOLID-STATE IMAGE SENSOR, METHOD OF PRODUCING THE SAME, AND ELECTRONIC APPARATUS

CROSS REFERENCE TO RELATED APPLICATIONS

This application is a continuation of U.S. patent application Ser. No. 15/345,967, filed Nov. 8, 2016, which is a continuation of U.S. patent application Ser. No. 14/570,765, filed Dec. 15, 2014, now U.S. Pat. No. 9,515,115, which claims the benefit of Japanese Priority Patent Application JP 2013-263632 filed Dec. 20, 2013, the entire disclosures of which are incorporated herein by reference.

BACKGROUND

The present disclosure relates to a solid-state image sensor, a method of producing the solid-state image sensor, and an electronic apparatus, and particularly to a solid-state image sensor, a method of producing the solid-state image sensor, and an electronic apparatus that can provide a solid-state image sensor ensuring the reliability of wiring.

For the image sensor, the size of pixels is desired to be reduced to increase the number of pixels. However, because there is a need to arrange a plurality of pixel transistors such as a transfer transistor, a selection transistor, a reset transistor, and an amplification transistor in a pixel area of the image sensor, a proportion of the area occupied by a photoelectric conversion unit is reduced and properties such as sensitivity and saturation properties may be deteriorated if the size of pixels is reduced.

In view of the above, a laminated structure where a photoelectric conversion layer is formed on a substrate in which a pixel transistor or a wiring layer is formed for ensuring the area of a photoelectric conversion unit and minimizing the deterioration of properties, has been proposed (see, for example, Japanese Patent Application Laid-open No. 2001-144279 and Japanese Patent Application Laid-open No. 1992-103168)

Moreover, a structure where a silicon substrate in which a compound semiconductor having, for example, a chalcopyrite structure is used as a photoelectric conversion layer to form a pixel transistor and a photoelectric conversion layer formed of a compound semiconductor are laminated has also been proposed (see, for example, Japanese Patent Application Laid-open No. 2007-123720).

SUMMARY

Incidentally, in a silicon device whose wiring is formed of copper (Cu) or aluminum (Al), the temperature in which the reliability of wiring can be ensured is generally not more than 400° C. For that reason, the temperature limits the forming of a photoelectric conversion layer on a silicon substrate in which a device such as a pixel transistor is formed. Specifically, in order to form a photoelectric conversion layer on a silicon substrate in which a device such as a pixel transistor is formed, the forming needs to be performed under the temperature condition of not more than 400° C.

However, in the case where a photoelectric conversion layer is formed by a compound semiconductor, for example, because the deposition temperature (or annealing temperature) of a general compound semiconductor is about 500° C. to 650° C. (or more), it may be impossible to obtain sufficient photoelectric conversion properties if the deposition is performed at the temperature of not more than 400° C. Moreover, also in the case where a photoelectric conversion layer is formed by a silicon single crystal, because the normal epitaxial temperature is not less than 900° C., it may be impossible to overcome the temperature limitation for ensuring reliability of wiring.

The present disclosure has been made in view of the above circumstances, and it is desirable to provide a solid-state image sensor that can ensure the reliability of wiring.

A solid-state image sensor according to a first embodiment of the present disclosure includes a pixel formed, upon forming a structure where a photoelectric conversion layer is laminated on a wiring layer constituting a pixel circuit, by forming at least the photoelectric conversion layer and a wiring layer bonding layer on a different substrate from a semiconductor substrate in which the wiring layer is formed, and by bonding the wiring layer bonding film of the different substrate and the wiring layer of the semiconductor substrate together.

A method of producing a solid-state image sensor according to a second embodiment of the present disclosure includes forming, upon forming a structure where a photoelectric conversion layer is laminated on a wiring layer constituting a pixel circuit, at least the photoelectric conversion layer and a wiring layer bonding layer on a different substrate from a semiconductor substrate in which the wiring layer is formed, and bonding the wiring layer bonding film of the different substrate and the wiring layer of the semiconductor substrate together.

An electronic apparatus according to a third embodiment of the present disclosure includes a solid-state image sensor including a pixel formed, upon forming a structure where a photoelectric conversion layer is laminated on a wiring layer constituting a pixel circuit, by forming at least the photoelectric conversion layer and a wiring layer bonding layer on a different substrate from a semiconductor substrate in which the wiring layer is formed, and by bonding the wiring layer bonding film of the different substrate and the wiring layer of the semiconductor substrate together.

In the first to third embodiments of the present disclosure, upon forming a structure where a photoelectric conversion layer is laminated on a wiring layer constituting a pixel circuit, a pixel formed by forming at least the photoelectric conversion layer and a wiring layer bonding layer on a different substrate from a semiconductor substrate in which the wiring layer is formed, and by bonding the wiring layer bonding film of the different substrate and the wiring layer of the semiconductor substrate is provided.

A solid-state image sensor and an electronic apparatus may be separated or may be a module integrated into another apparatus.

According to the first to third embodiments of the present disclosure, it is possible to provide a solid-state image sensor that can ensure the reliability of wiring.

It should be noted that the effects described above are not necessarily restrictive, and may be any of those described in the present disclosure.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 7 is a diagram for explaining the method of producing the solid-state image sensor having the first cross-sectional structure;

FIGS. 9A-9B are diagrams for explaining the method of producing the solid-state image sensor having the first cross-sectional structure;

DETAILED DESCRIPTION OF EMBODIMENTS

Figure 1:
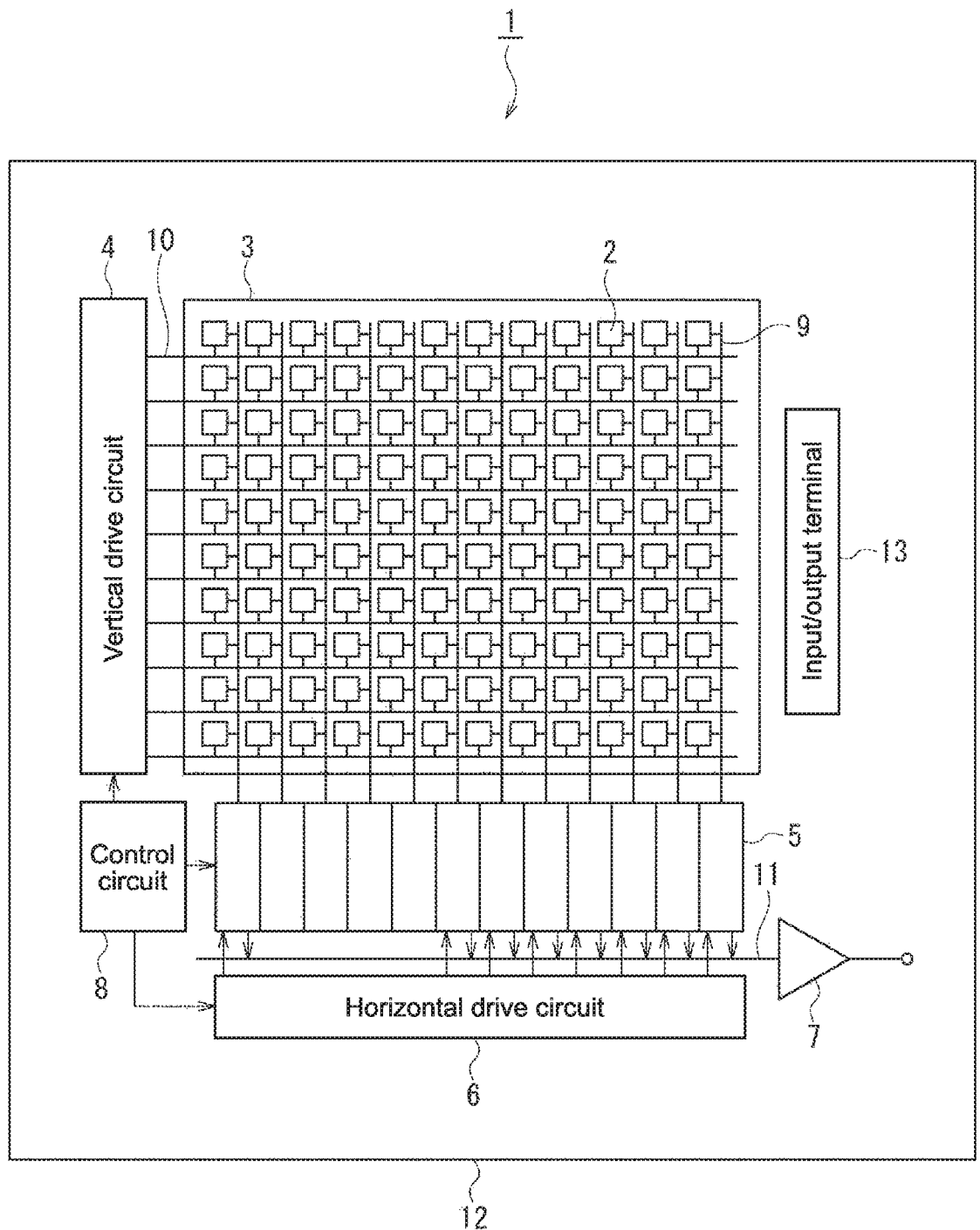
FIG. 1 is a diagram showing a configuration of a solid-state image sensor according to an embodiment of the present disclosure.

Hereinafter, embodiments for implementing the present disclosure (hereinafter, referred to as embodiments) will be described. It should be noted that a description will be made in the following order.
1. Schematic configuration of solid-state image sensor
2. First cross-sectional structure of pixel
3. Method of producing pixel having first cross-sectional structure
4. Second cross-sectional structure of pixel
5. Method of producing pixel having second cross-sectional structure
6. Application example to electronic apparatus (1. Configuration Example of Solid-State Image Sensor)

FIG. 1 shows a configuration example of a solid-state image sensor according to an embodiment of the present disclosure.

A solid-state image sensor 1 shown in FIG. 1 is configured to include a pixel array portion 3 and a peripheral circuit portion surrounding it. In the pixel array portion 3, pixels 2 are arranged in a two-dimensional array form on a semiconductor substrate 12 that uses silicon (Si) as a semiconductor, for example. The peripheral circuit portion includes a vertical drive circuit 4, a column signal processing circuit 5, a horizontal drive circuit 6, an output circuit 7, a control circuit 8, and the like.

The pixel 2 is configured to include the photoelectric conversion unit and a plurality of pixel transistors. The plurality of pixel transistors include, for example, four MOS transistors of a transfer transistor, a selection transistor, a reset transistor, and an amplification transistor.

Moreover, the pixel 2 can have a pixel sharing structure. The pixel sharing structure includes a plurality of photoelectric conversion units, a plurality of transfer transistors, one shared floating diffusion area (FD), and another shared pixel transistor. Specifically, in the shared pixel, the photoelectric conversion unit and the transfer transistor constituting a plurality of unit pixels are configured to share another pixel transistor.

The control circuit 8 is configured to receive an input clock and data for commanding an operation mode or the like, and to output data such as internal information of the solid-state image sensor 1. Specifically, the control circuit 8 generates a clock signal or control signal that is the reference of the operations of the vertical drive circuit 4, the column signal processing circuit 5, the horizontal drive circuit 6, and the like, based on a vertical synchronous signal, a horizontal synchronous signal, and a master clock. Then, the control circuit 8 outputs the generated clock signal or control signal to the vertical drive circuit 4, the column signal processing circuit 5, the horizontal drive circuit 6, and the like.

The vertical drive circuit 4 includes a shift resistor, for example, and is configured to select a predetermined pixel drive wiring 10, to supply a pulse for driving the pixel 2 to the selected pixel drive wiring 10, and to drive the pixels 2 row by row. Specifically, the vertical drive circuit 4 is configured to selectively scan each pixel 2 in the pixel array portion 3 row by row successively in a vertical direction, and to supply a pixel signal based on a signal charge generated depending on the amount of received light in the photoelectric conversion unit of each pixel 2 to the column signal processing circuit 5 through a vertical signal line 9.

The column signal processing circuit 5 is arranged for each column of the pixels 2 and is configured to perform signal processing such as noise removal on a signal output from a row of pixels 2 for each pixel column. For example, the column signal processing circuit 5 is configured to perform signal processing such as correlated double sampling (CDS) and AD conversion for removing unique fixed pattern noise of a pixel.

The horizontal drive circuit 6 includes, for example, a shift register, and is configured to select each column signal processing circuit 5 in order by successively outputting a horizontal scanning pulse, and to cause each column signal processing circuit 5 to output a pixel signal to a horizontal signal line 11.

The output circuit 7 is configured to perform signal processing on the signal that is successively supplied from each column signal processing circuit 5 through the horizontal signal line 11, and to output the signal. The output circuit 7 may perform only buffering, or may perform black level adjusting, column variation correction, various types of digital signal processing, or the like. An input/output terminal 13 exchanges a signal with the outside.

The solid-state image sensor 1 configured as described above includes a CMOS image sensor of a column AD system in which the column signal processing circuits 5 that perform CDS processing and AD conversion are arranged for each pixel column.

(Circuit Configuration Example of Pixel)

Figure 2:
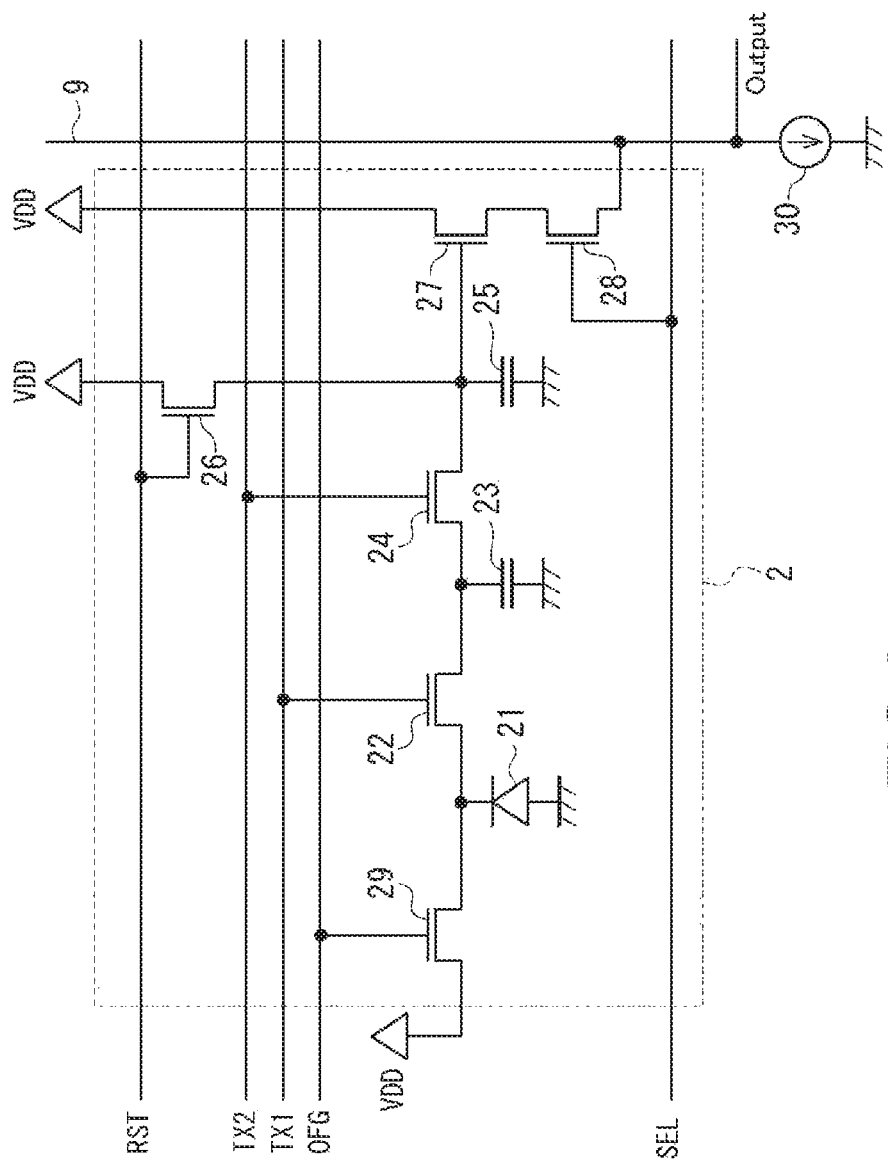
FIG. 2 is a diagram showing a circuit configuration example of a pixel.

FIG. 2 shows a circuit configuration example of the pixel 2.

The pixel 2 shown in FIG. 2 has a configuration that can achieve an electronic global shutter function.

The pixel 2 includes a photoelectric conversion unit 21, a first transfer transistor 22, a memory unit (MEM) 23, a second transfer transistor 24, a floating diffusion area (FD) 25, a reset transistor 26, an amplification transistor 27, a selection transistor 28, and a discharging transistor 29.

The photoelectric conversion unit 21 is configured to generate a charge depending on the amount of received light (signal charge) and to store the generated charge. One terminal of the photoelectric conversion unit 21 is grounded and the other terminal is connected to the memory unit 23 via the first transfer transistor 22. Moreover, to the photoelectric conversion unit 21, also the discharging transistor 29 that discharges unnecessary charges is connected.

The first transfer transistor 22 is configured to transfer charges generated by the photoelectric conversion unit 21 to the memory unit 23 when the first transfer transistor 22 is turned on by the first transfer signal TX1. The memory unit 23 is configured to temporarily hold charges before transferring the charges to the FD 25.

The second transfer transistor 24 is configured to read charges of the memory unit 23 and transfer the charges to the FD 25 when the second transfer transistor 24 is turned on by a second transfer signal TX2.

The FD 25 is configured to hold charges transferred from the memory unit 23. The reset transistor 26 is configured to reset the potential of the FD 25 when the reset transistor 26 is turned on by a reset signal RST and the charges stored in the FD 25 are discharged to a constant voltage source VDD.

The amplification transistor 27 is configured to output a pixel signal depending on the potential of the FD 25. Specifically, the amplification transistor 27 and a load MOS 30 being a constant current source constitute a source follower circuit, and a pixel signal that represents the level depending on the charges stored in the FD 25 is output from the amplification transistor 27 to the column signal processing circuit 5 via the selection transistor 28. The load MOS 30 is arranged in the column signal processing circuit 5, for example.

The selection transistor 28 is configured to be turned on when a selection signal SEL selects the pixel 2, and to output the pixel signal of the pixel 2 to the column signal processing circuit 5 through the vertical signal line 9.

The discharging transistor 29 is configured to discharge charges stored in the photoelectric conversion unit 21 to the constant voltage source VDD when the discharging transistor 29 is turned on by a discharge signal OFG.

The first transfer signal TX1, the transfer signal TX2, the reset signal RST, the discharge signal OFG, and the selection signal SEL are supplied from the vertical drive circuit 4 through the pixel drive wiring 10.

The operation of the pixel 2 having a pixel structure shown in FIG. 2 will be simply described.

First, the discharge signal OFG at a high level is supplied to the discharging transistor 29 before the exposure is started, and thus, the discharging transistor 29 is turned on. The charges stored in the photoelectric conversion unit 21 are discharged to the constant voltage source VDD and the photoelectric conversion unit 21 is reset.

When the discharging transistor 29 is turned off by the discharge signal OFG at a low level after the photoelectric conversion unit 21 is reset, the exposure is started in all pixels of the pixel array portion 3.

The first transfer transistor 22 is turned on by the first transfer signal TX1 in all pixels of the pixel array portion 3 when a predetermined exposure time period that is set in advance passes, and the charges stored in the photoelectric conversion unit 21 are transferred to the memory unit 23.

After the first transfer transistor 22 is turned off, the charges held in the memory unit 23 of each pixel 2 are successively read row by row by the column signal processing circuit 5. In the reading operation, the second transfer transistor 24 of the pixel 2 in a reading row is turned on by the transfer signal TX2, and the charges held in the memory unit 23 are transferred to the FD 25. Then, the selection transistor 28 is turned on by the selection signal SEL, and thus, a signal that represents the level depending on the charges stored in the FD 25 is output from the amplification transistor 27 to the column signal processing circuit 5 via the selection transistor 28.

As described above, the pixel 2 having the pixel structure shown in FIG. 2 is capable of operating (imaging) with a global shutter system in which the same exposure time period is set in all pixels of the pixel array portion 3, charges are temporarily held in the memory unit 23 after the exposure, and charges are successively read from the memory unit 23 row by row.

It should be noted that the pixel structure of the pixel 2 is not limited to the one shown in FIG. 2. For example, the pixel 2 may have a structure in which the pixel 2 has no memory unit 23 and operates with a so-called rolling shutter system.

(2. First Cross-Sectional Structure of Pixel)

Figure 3:
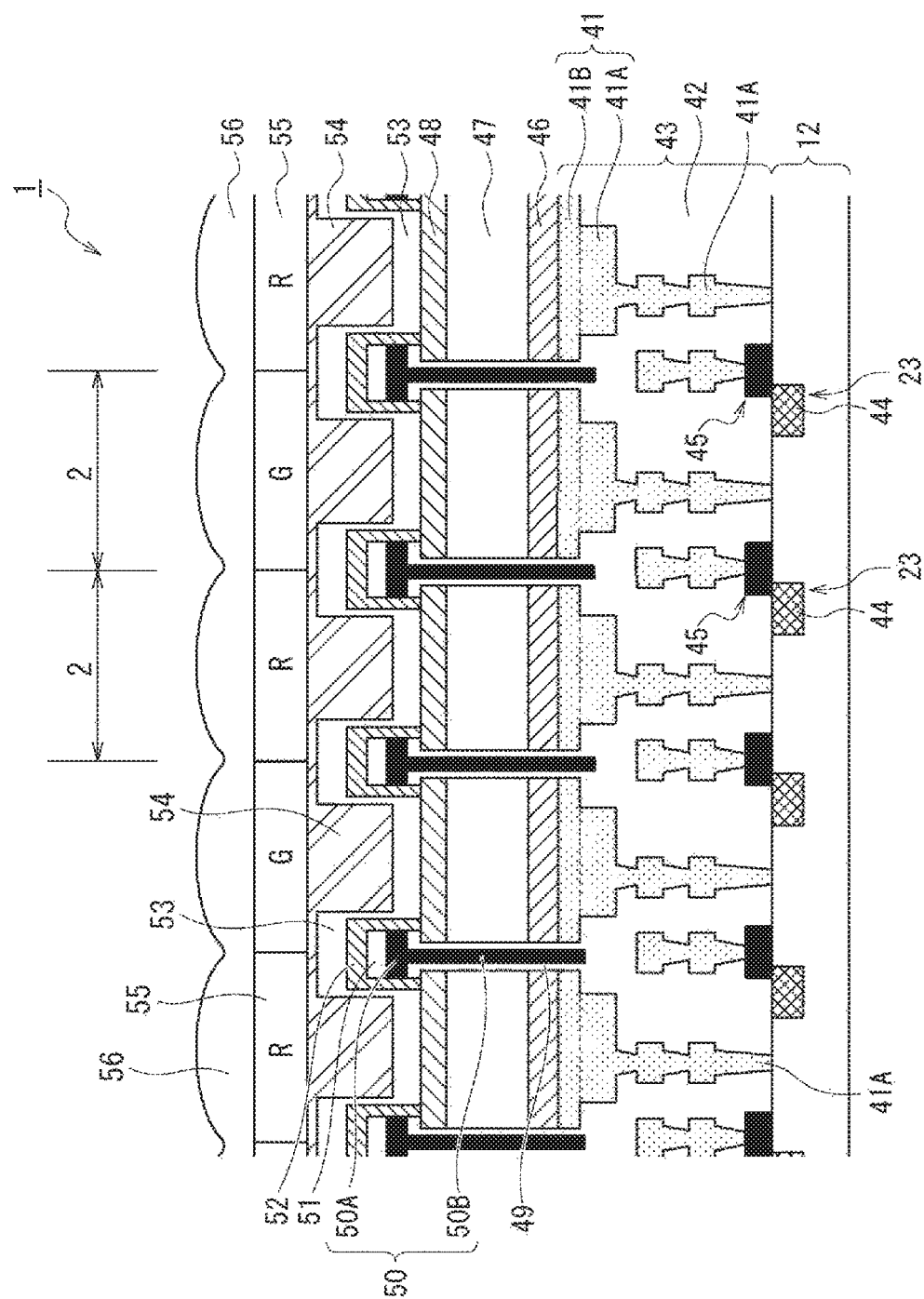
FIG. 3 is a diagram showing a first cross-sectional structure of a pixel.

FIG. 3 is a diagram showing a first cross-sectional structure of the pixel 2 of the solid-state image sensor 1.

In the solid-state image sensor 1, on the semiconductor substrate 12 formed of p-type (first conductive type) silicon (Si), for example, a multilayered wiring layer 43 is formed.

The multilayered wiring layer 43 includes a plurality of wiring layers 41 formed by Cu, Al, W (tungsten), tantalum (Ta), titanium (Ti), or the like, and an interlayer insulating film 42.

It should be noted that the plurality of wiring layers 41 are configured by bonding of lower side wiring layers 41A on a side of the semiconductor substrate 12 to upper side wiring layers 41B on a side of a photoelectric conversion layer 47 as will be described later. In the plurality of wiring layers 41 shown in FIG. 3, the boundary between the lower side wiring layers 41A and the upper side wiring layers 41B is shown by broken lines.

The width (length in a horizontal direction) of wiring cross-section of the uppermost layer of the lower side wiring layers 41A is shorter than the width of the upper side wiring layers 41B, and the cross-sectional shape of the wiring of the uppermost layer of the lower side wiring layers 41A and the upper side wiring layers 41B is a convex-down shape. It should be noted that in FIG. 3, the thickness of the upper side wiring layers 41B is similar to that of the thickness of the wiring of the uppermost layer of the lower side wiring layers 41A to facilitate visualization. In fact, the thickness of the upper side wiring layers 41B is smaller than the thickness of the wiring of the uppermost layer of the lower side wiring layers 41A (e.g., several hundred nm), for example, not more than 100 nm.

In the semiconductor substrate 12, the memory unit 23 that holds charges temporarily is formed by an N-type (second conductive type) semiconductor area 44 for each pixel 2. Moreover, on a plane that comes into contact with the semiconductor substrate 12 in the multilayered wiring layer 43, a plurality of pixel transistors 45 such as the first transfer transistor 22 and the second transfer transistor 24 are formed.

On the upper side of the multilayered wiring layer 43, a lower electrode layer 46, the photoelectric conversion layer 47, and a buffer layer 48 are formed for each pixel. The lower electrode layer 46 can be formed by, for example, molybdenum (Mo), and the photoelectric conversion layer 47 can be formed by, for example, CuInSe2 (CIS-based thin film) being a semiconductor thin film having a chalcopyrite structure, Cu(In,Ga)Se2 (CIGS-based thin film) obtained by dissolving it in Ga, or the like. Moreover, the buffer layer 48 can be formed by laminating cadmium sulfide (CdS) and zinc oxide (ZnO), for example. The lower electrode layer 46, the photoelectric conversion layer 47, the buffer layer 48, and an upper electrode layer 53 (described later) constitute the photoelectric conversion unit 21.

On the boundary between adjacent pixels, the insulating layer 49 formed of a silicon oxide ($SiO_2$) or the like and an inter-pixel light blocking portion 50 are formed. The insulating layer 49 and the inter-pixel light blocking portion 50 separate the lower electrode layer 46, the photoelectric conversion layer 47, and the buffer layer 48 of each pixel 2. The inter-pixel light blocking portion 50 are constituted of an inter-pixel light blocking film 50A formed above the buffer layer 48 in a plane direction, and a trench portion 50B formed under the buffer layer 48 in a depth direction. By providing the trench portion 50B to the pixel boundary portion, it is possible to prevent light from leaking into adjacent pixel. Thus, color mixture is reduced. In addition, it is possible to prevent light from leaking into the semiconductor area 44 being the memory unit 23. Thus, noise in a pixel signal can be reduced.

On the upper surface of the inter-pixel light blocking film 50A, a pad material 51 is formed. The pixel light blocking portion 50 is formed by tungsten (W) or the like, and the pad material 51 is formed by aluminum (Al) or the like. The pixel light blocking portion 50 and the pad material 51 may be formed by the same metal material.

An insulating layer 52 is formed on the pad material 51, and the upper electrode layer 53 is conformally deposited on the upper side of the insulating layer 52 and the buffer layer 48. After the upper surface of the upper electrode layer 53 is planarized by a passivation film 54, a color filter 55 and an on-chip lens 56 are formed. The upper electrode layer 53 is formed by a material that transmits light in a wavelength range used by a device, e.g., a transparent electrode including indium oxide (ITO), ZnO, or the like.

The solid-state image sensor 1 configured as described above is a front-surface irradiation-type MOS solid-state image sensor in which light is incident from a side of the surface of the semiconductor substrate 12, which is a side in which the plurality of pixel transistors 45 are formed.

Figure 4:
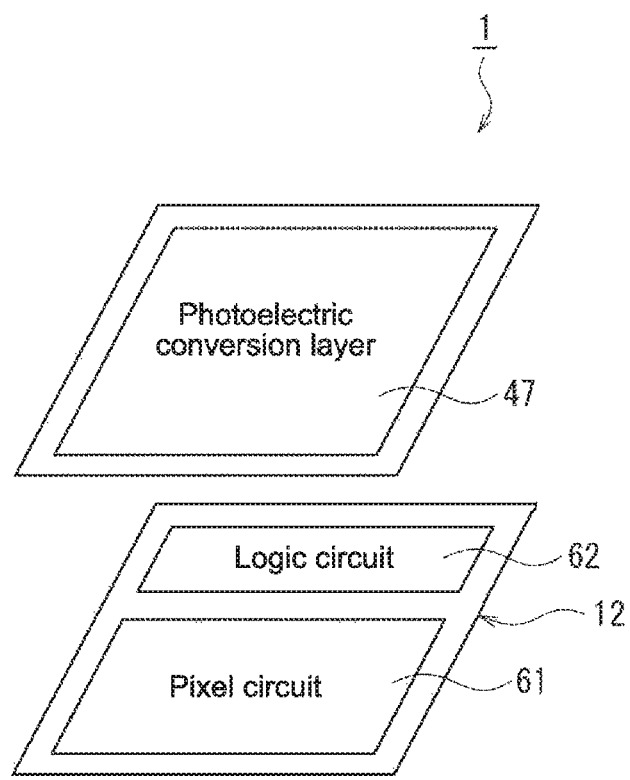
FIG. 4 is a diagram for explaining a method of producing a solid-state image sensor having the first cross-sectional structure.

Moreover, the solid-state image sensor 1 has a configuration where a pixel circuit 61 and a logic circuit 62 are formed of the multilayered wiring layer 43 on the semiconductor substrate 12, and the photoelectric conversion layer 47 is laminated thereon, as shown by FIG. 4, if the structure is simplified.

(3. Method of Producing Pixel Having First Cross-Sectional Structure)

With reference to FIG. 5A to FIG. 19, a method of producing the solid-state image sensor 1 having the first cross-sectional structure will be described.

Figure 5A:
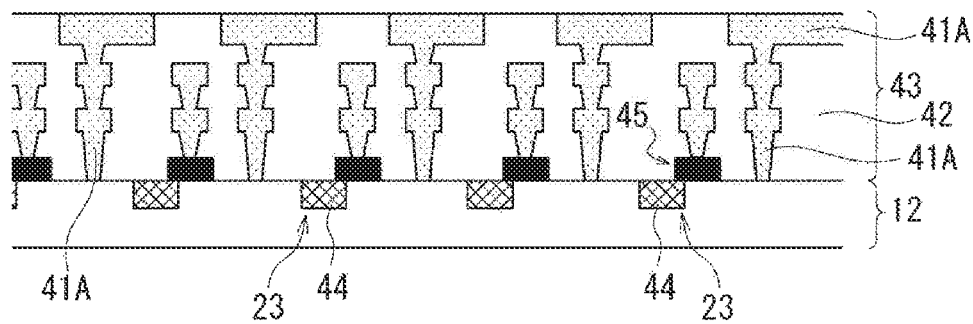
FIGS. 5A-5D are diagrams for explaining the method of producing the solid-state image sensor having the first cross-sectional structure.

First, as shown in FIG. 5A, in the semiconductor substrate 12 having a p-type semiconductor area, the N-type semiconductor area 44 is formed for each pixel 2 as the memory unit 23, and the plurality of pixel transistors 45 and the multilayered wiring layer 43 are formed on the semiconductor substrate 12, for example.

It should be noted that the multilayered wiring layer 43 formed in this process is a portion of the lower side wiring layers 41A and the interlayer insulating film 42 excluding the upper side wiring layers 41B on a side of the photoelectric conversion layer 47. In this embodiment, as the material of the lower side wiring layers 41A, Cu is used. It should be noted that the plurality of wiring layers 41 do not need to include the same material. For example, the plurality of wiring layers 41 may be divided into an upper layer including Cu and a lower layer including W.

Figure 5B:

Moreover, as shown in FIG. 5B, a supporting substrate 81 is prepared separately from the semiconductor substrate 12 in which the plurality of pixel transistors 45 and the multilayered wiring layer 43 are formed. The supporting substrate 81 includes, glass, Si, GaAs, InP, GaN, GaP, SiC, sapphire or the like. Alternatively, the supporting substrate 81 may include glass and silicon.

Figure 5C:
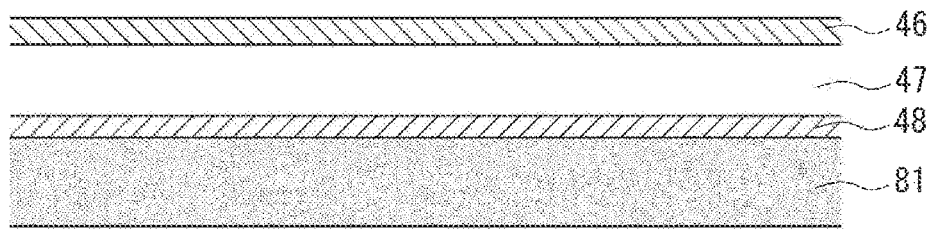

Then, as shown in FIG. 5C, on the supporting substrate 81, the buffer layer 48, the photoelectric conversion layer 47, and the lower electrode layer 46 are formed in the stated order.

As described above, if Cu(In,Ga)Se2 (CIGS-based thin film) is adopted as the material of the photoelectric conversion layer 47, for example, the buffer layer 48 may be formed by cadmium sulfide (CdS) and zinc oxide (ZnO), and the lower electrode layer 46 may be formed by Mo or the like.

It should be noted that as the material of the photoelectric conversion layer 47, not only the CIGS-based thin film but also amorphous Si, polycrystalline Si, single crystalline Si, a III-V compound semiconductor, a CdTe compound semiconductor, a dye-sensitized material, an organic semiconductor may be used. As materials of the buffer layer 48 and the lower electrode layer 46, optimal materials are selected depending on the material of the photoelectric conversion layer 47. Moreover, it is possible to omit the buffer layer 48.

Figure 5D:
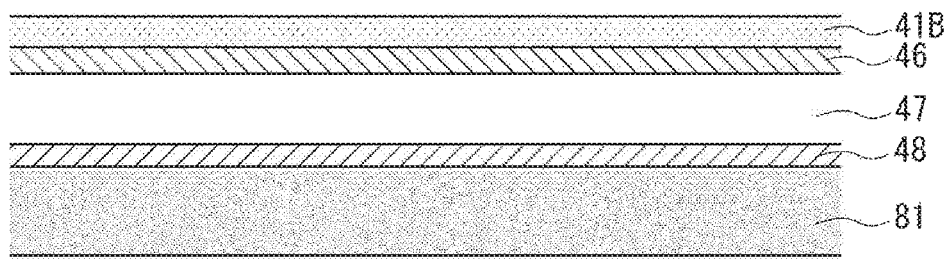

Next, as shown in FIG. 5D, the upper side wiring layers 41B is deposited on the lower electrode layer 46 with the same wiring material as that of the lower side wiring layers 41A of the multilayered wiring layer 43 formed on the semiconductor substrate 12. The upper side wiring layers 41B is the wiring layer bonding film for bonding to the lower side wiring layers 41A on a side of the semiconductor substrate 12.

Figure 6A:
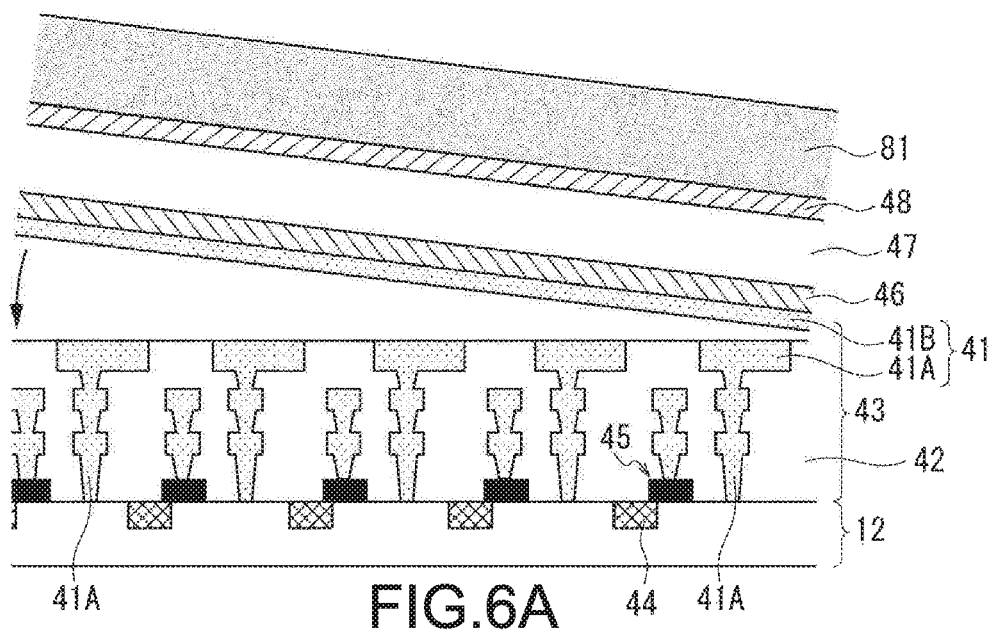
FIGS. 6A-6C are diagrams for explaining the method of producing the solid-state image sensor having the first cross-sectional structure.
Figure 6B:
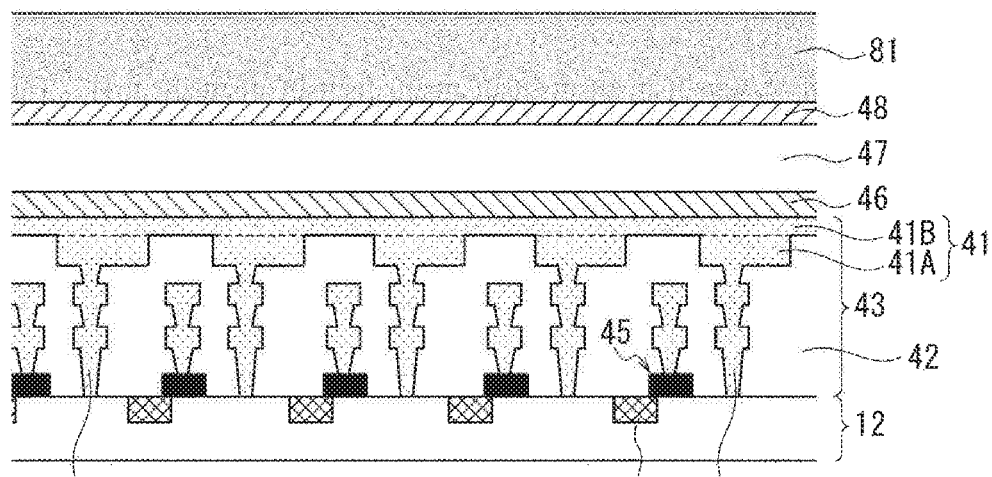

Next, as shown in FIG. 6A, the supporting substrate 81 in which the photoelectric conversion layer 47 or the like is deposited is inverted, and the lower side wiring layers 41A and the upper side wiring layers 41B are bonded together so that the lower side wiring layers 41A and the upper side wiring layers 41B face to each other as shown in FIG. 6B.

Figure 6C:
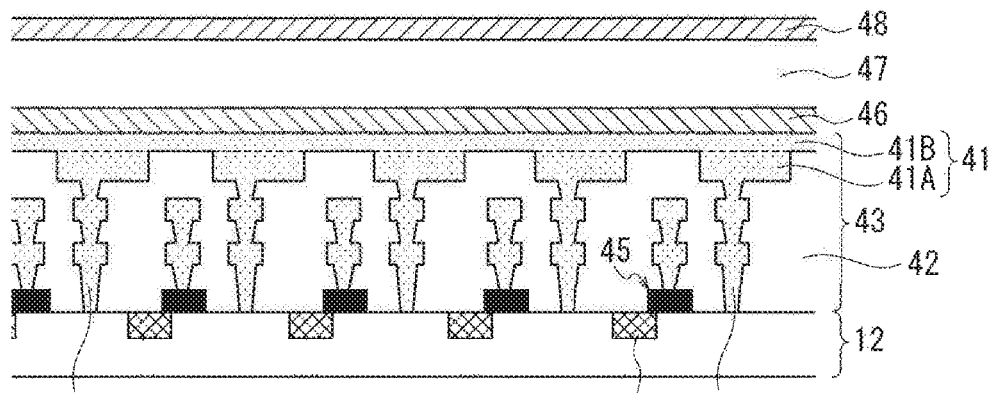

After that, as shown in FIG. 6C, the supporting substrate 81 is removed by polishing or a wetting process.

After that, as shown in FIG. 7, the lower electrode layer 46, the photoelectric conversion layer 47, the buffer layer 48, and the upper side wiring layers 41B on the boundaries of the pixels 2 are removed with a photolithography technique and a dry etching, and thus, an opening 91 is formed on the pixel boundary portion.

Moreover, also the lower electrode layer 46, the photoelectric conversion layer 47, the buffer layer 48, and, the upper side wiring layers 41B in a peripheral portion 100 that is outside of the pixel array portion 3 and a pad portion 101 that is outside of the peripheral portion 100 are removed with a photolithography technique and a dry etching, and thus, an opening 92 and an opening 93 are formed.

Figure 8:
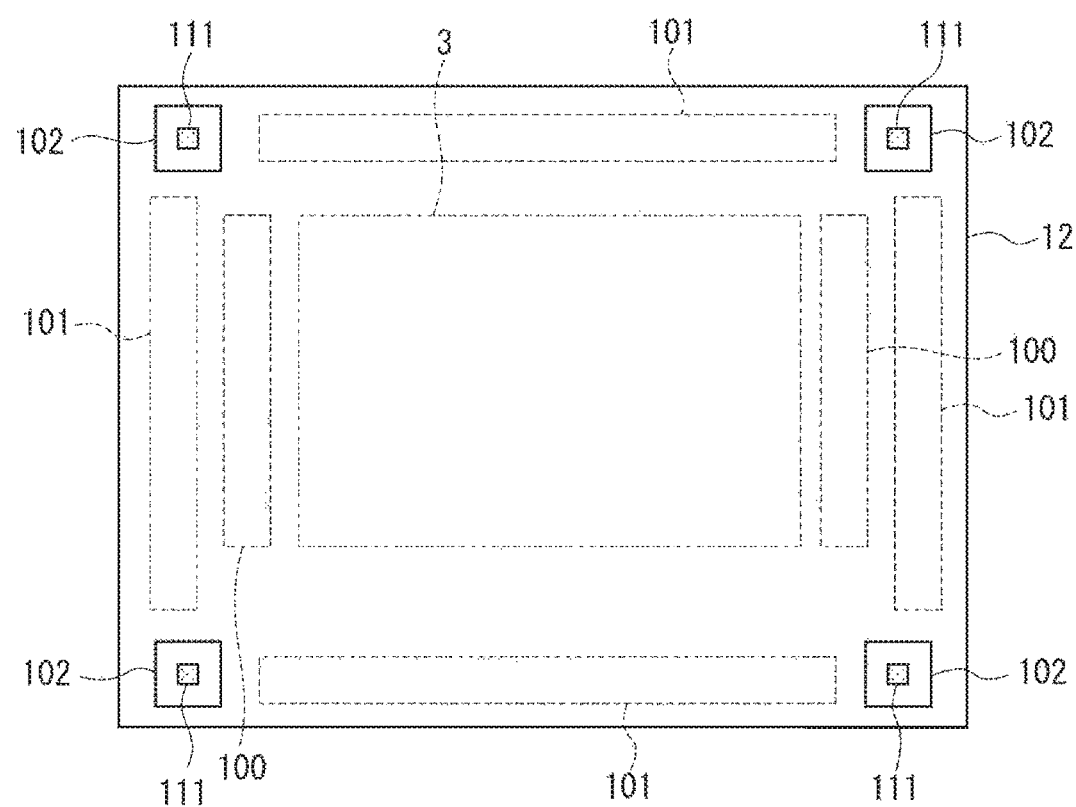
FIG. 8 is a diagram for explaining the method of producing the solid-state image sensor having the first cross-sectional structure.
Figure 10:
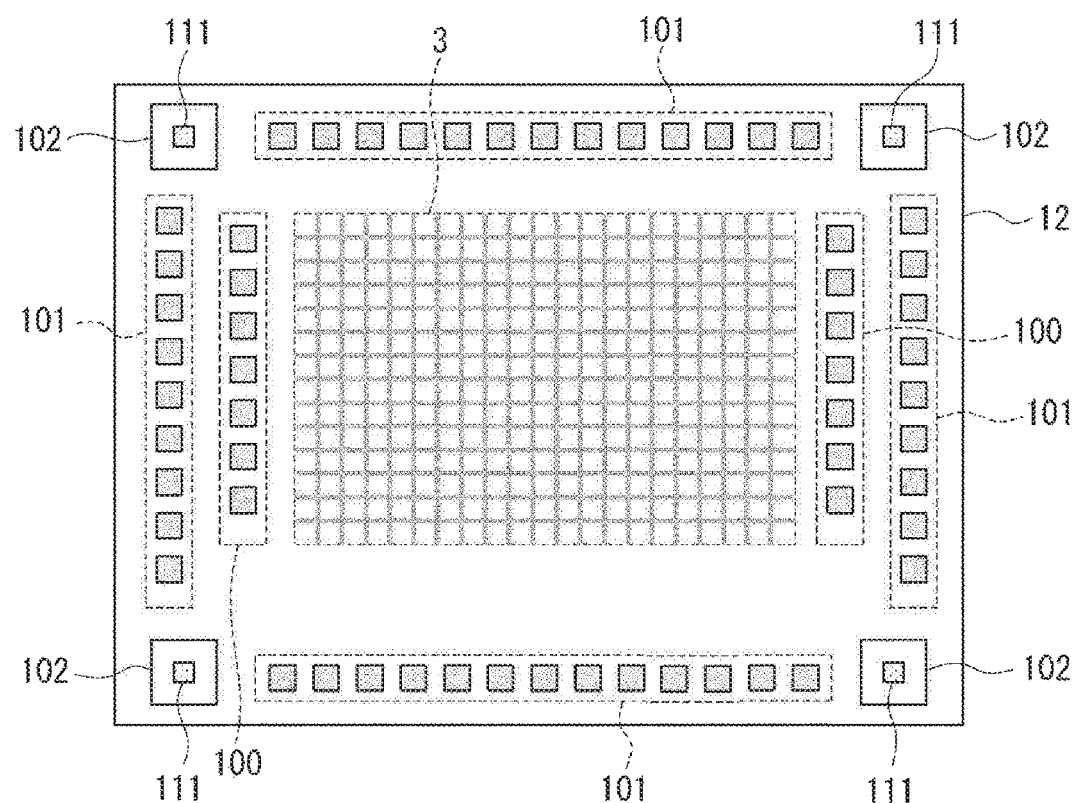
FIG. 10 is a diagram for explaining the method of producing the solid-state image sensor having the first cross-sectional structure.

With reference to FIG. 8 to FIG. 10, the forming of the openings 91 to 93 will be described in detail.

FIG. 8 is a diagram showing the arrangement relationship between the pixel array portion 3, the peripheral portion 100, and the pad portion 101 on the semiconductor substrate 12.

The pixel array portion 3 is arranged in the central are of the solid-state image sensor 1, the peripheral portion 100 is arranged on the outside of the pixel array portion 3, and the pad portion 101 is arranged on the outside thereof.

The peripheral portion 100 is an area in which a contact portion 131 (FIG. 12) that electrically connects the upper electrode layer 53 formed on the upper side of the photoelectric conversion layer 47 with the multilayered wiring layer 43 is formed. The pad portion 101 is an area in which a contact portion (FIG. 12) by which the solid-state image sensor 1 can exchange an electric signal with the outside is formed.

In the area of four corners of the solid-state image sensor 1, a mark area 102 in which an alignment mark 111 is formed is arranged.

It should be noted that the arrangement of the pad portion 101 and the mark area 102 shown in FIG. 8 is only an example, and arrangement other than that can be, of course, used.

With rough alignment in which the semiconductor substrate 12 (semiconductor wafer) is fixed at a predetermined position and the outer shape size is a standard one, the lower electrode layer 46, the photoelectric conversion layer 47, the buffer layer 48, and the upper side wiring layers 41B on the mark area 102 are etched. Accordingly, as shown in FIG. 9A, an opening 94 is formed in the mark area 102 and the alignment mark 111 can be visually observed. It should be noted that this process can be omitted in the case where the alignment mark 111 can be visually observed even if the opening 94 is not formed. Alternatively, it is possible to perform etching at the minimum degree, which is necessary for visually observing the alignment mark 111.

Then, based on the alignment mark 111 of the mark area 102, alignment is performed with high accuracy. Based on the high-accuracy alignment, in the pixel boundary portion of the pixel array portion 3, the peripheral portion 100, and the pad portion 101, as shown in FIG. 9B, a layer above the upper side wiring layers 41B is etched. Accordingly, the openings 91 to 93 are formed.

FIG. 10 is a schematic diagram showing the state after the openings 91 to 93 are formed.

In this way, the openings 91 to 93 shown in FIG. 7 are formed on the semiconductor substrate 12.

Figure 11:
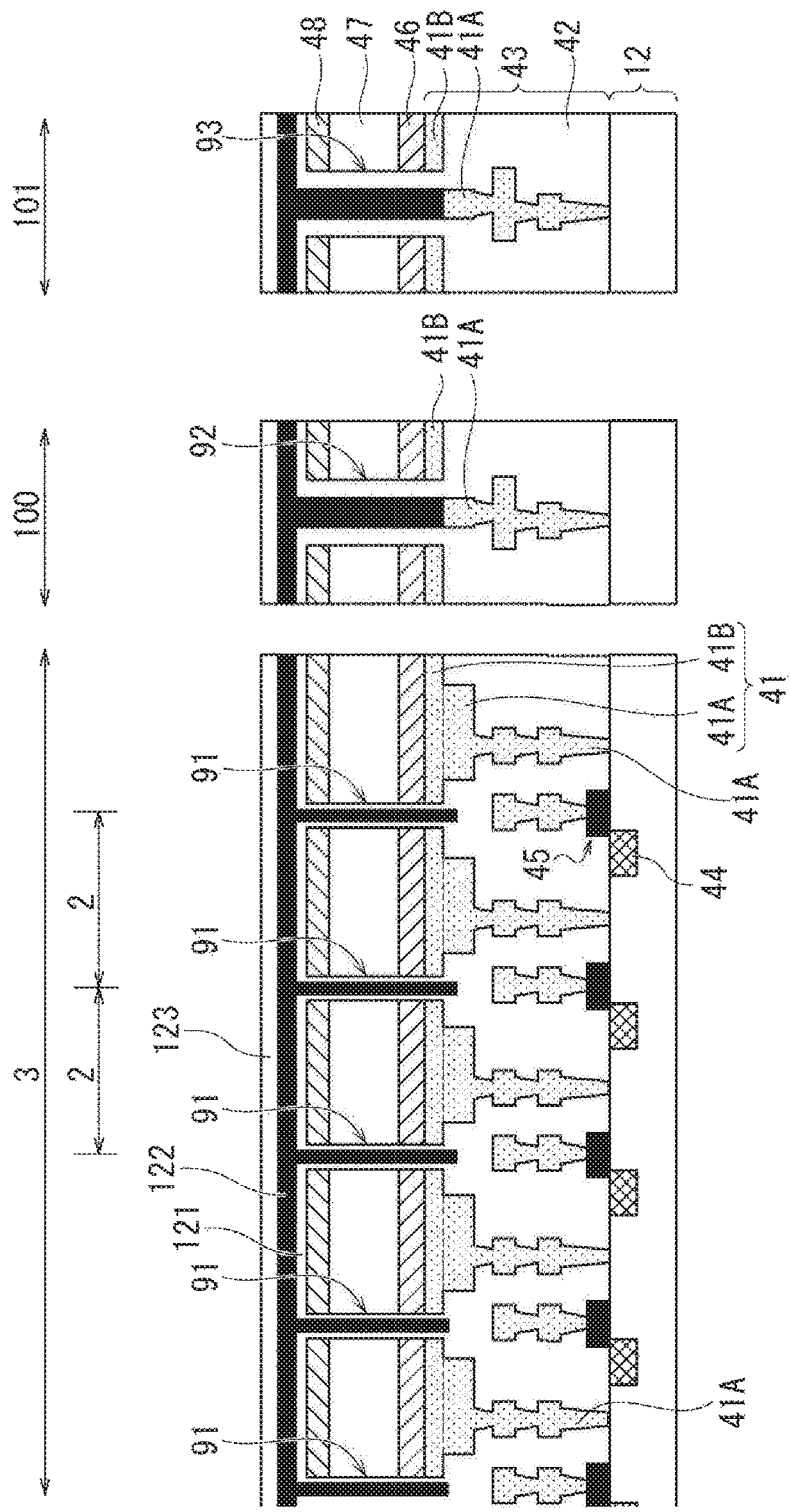
FIG. 11 is a diagram for explaining the method of producing the solid-state image sensor having the first cross-sectional structure.

Then, as shown in FIG. 11, on the opening 91 to 93 and the upper surface of the buffer layer 48, an insulating material 121, a light blocking material 122, and a pad material 123 are deposited in the stated order. The insulating material 121 includes, for example, silicon oxide ($SiO_2$), SiN, HfO, or the like. The light blocking material 122 may have a laminated structure of tungsten (W) and TiN, and the pad material 123 may include Al or an Al alloy that contains slight amount of Cu.

Figure 12:
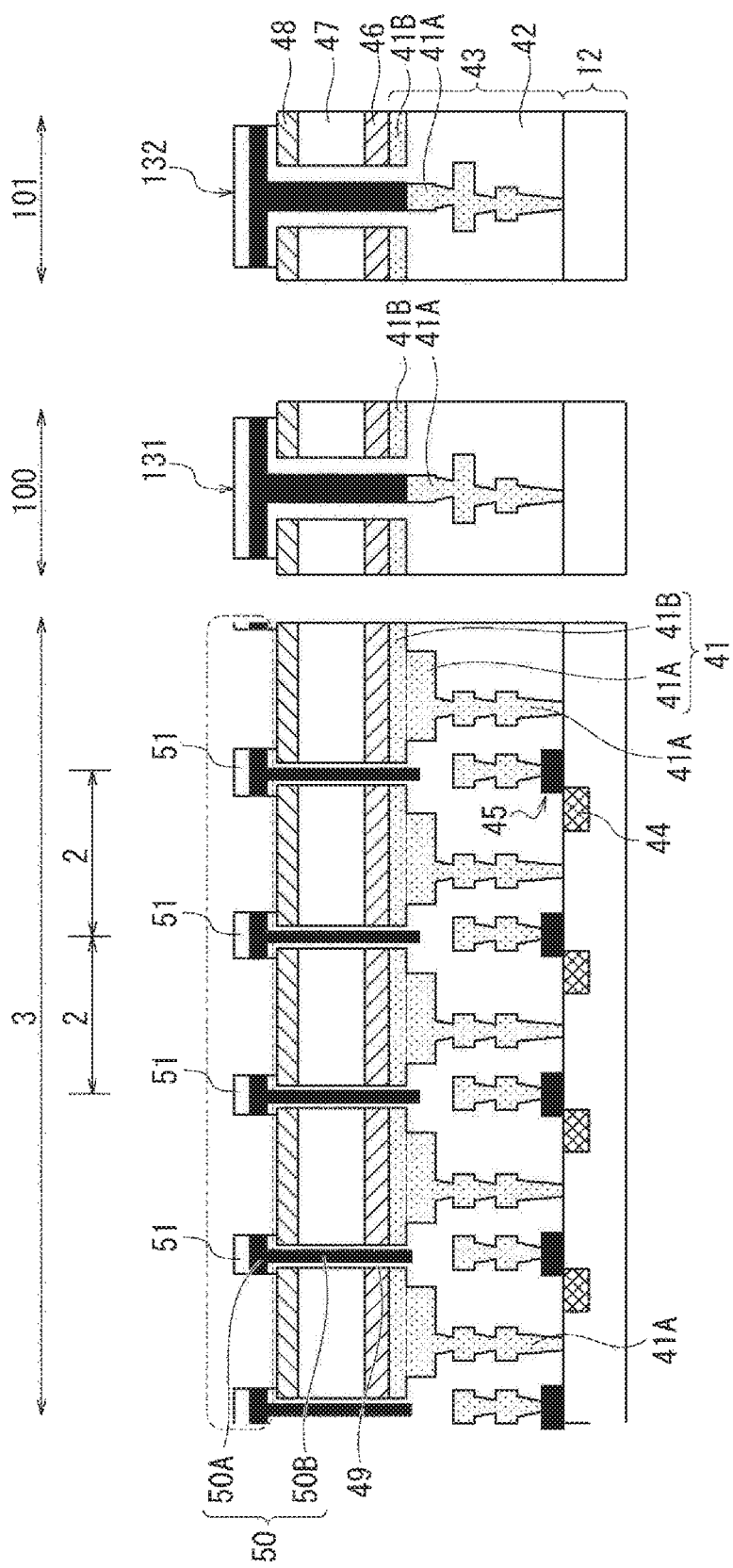
FIG. 12 is a diagram for explaining the method of producing the solid-state image sensor having the first cross-sectional structure.

Next, as shown in FIG. 12, in the pixel array portion 3, a film on the upper side of the buffer layer 48 is etched so that the light-receiving area of each pixel 2 is opened, and the peripheral portion 100 and the pad portion 101 are etched so that the contact portions 131 and 132 are remained. It should be noted that the insulating material 121 and the light blocking material 122 above the buffer layer 48 of the pixel array portion 3, which are shown by broken lines in FIG. 12, may be removed in an etching process.

Figure 13:
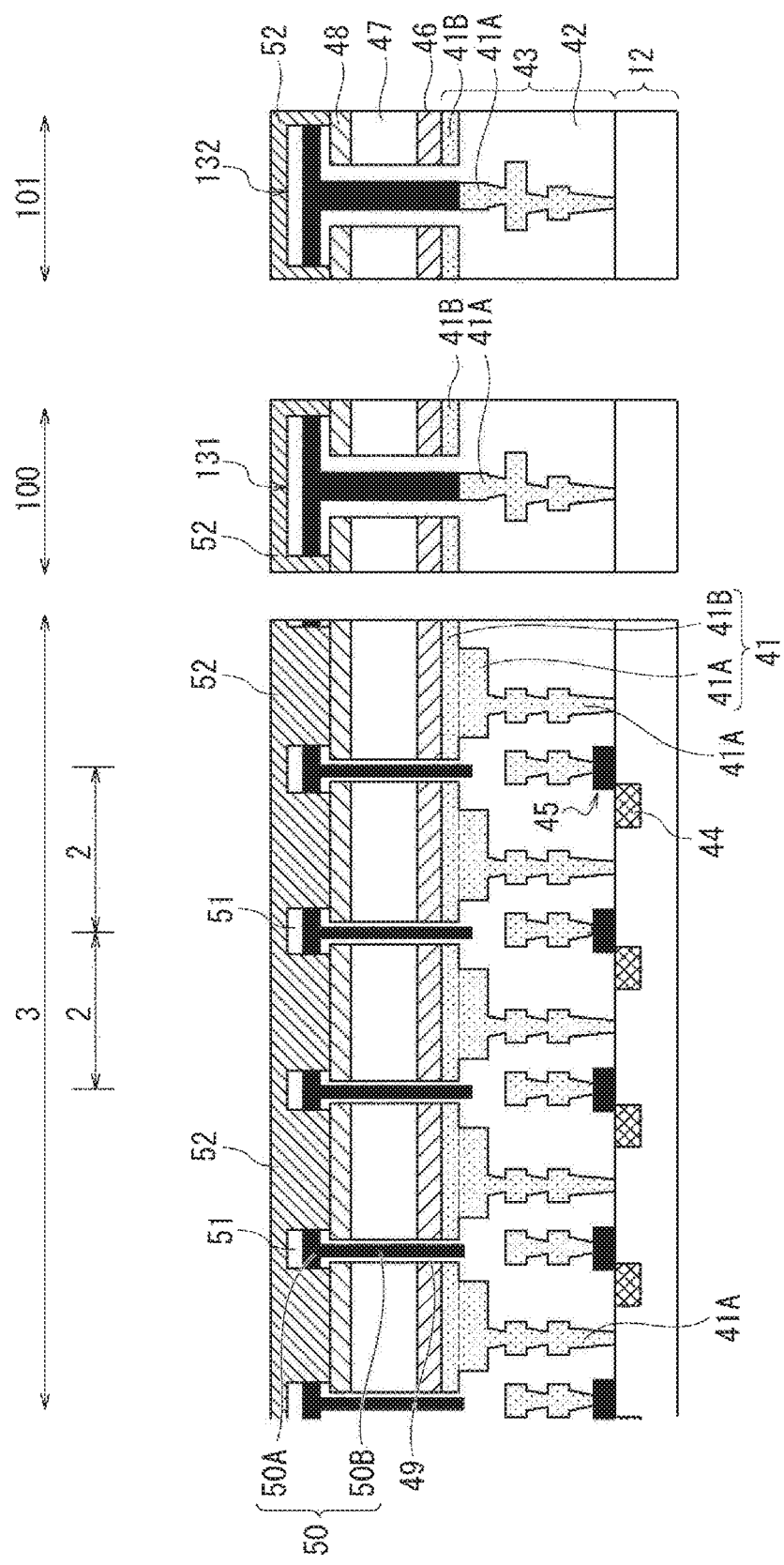
FIG. 13 is a diagram for explaining the method of producing the solid-state image sensor having the first cross-sectional structure.
Figure 14:
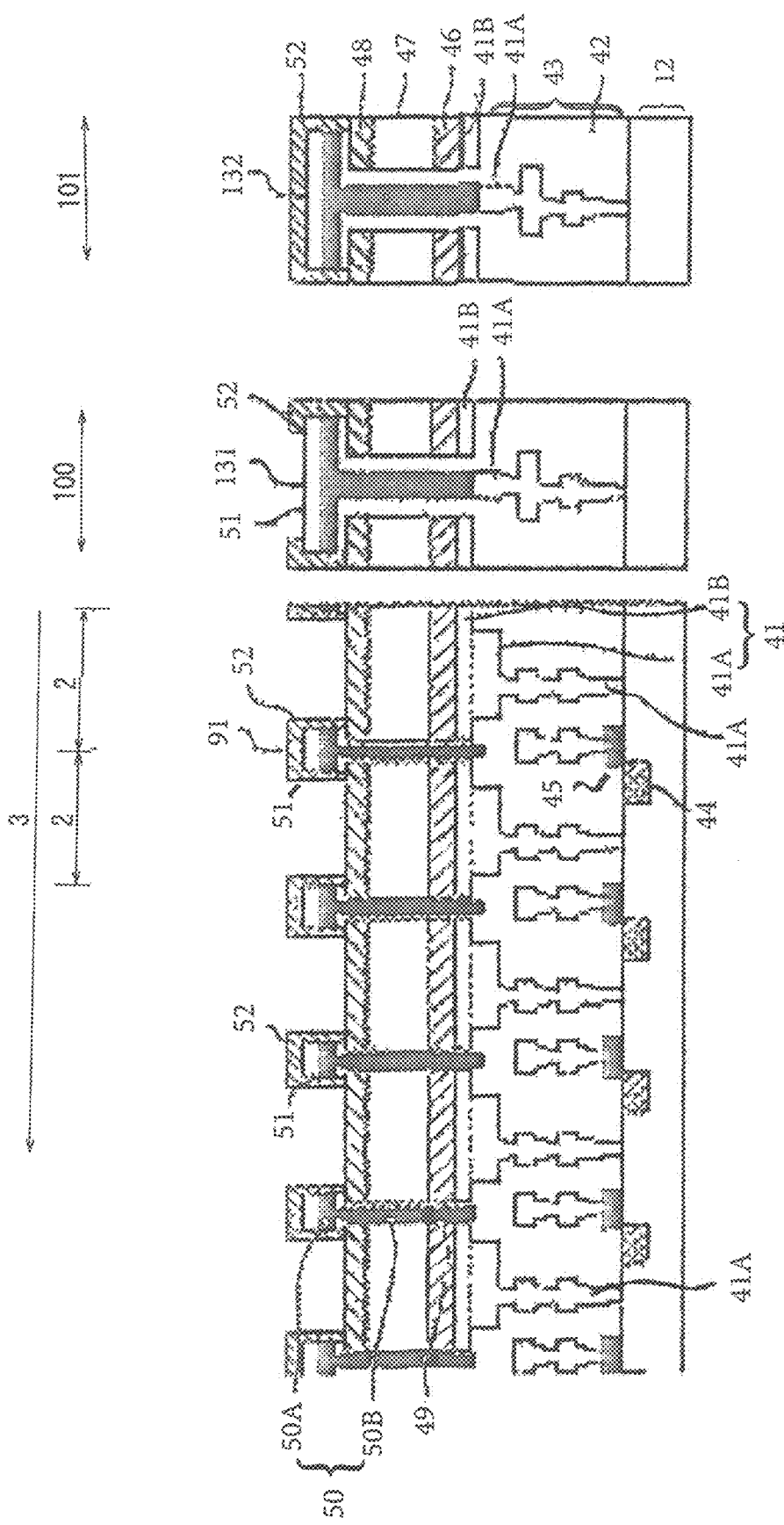
FIG. 14 is a diagram for explaining the method of producing the solid-state image sensor having the first cross-sectional structure.

Next, as shown in FIG. 13, the insulating layer 52 including, for example, silicon oxide ($SiO_2$) is deposited on the entire surface, and is planarized with chemical mechanical polishing (CMP) or the like. After that, as shown in FIG. 14, the insulating layer 52 is etched in the pixel array portion 3 so that the light-receiving area of each pixel 2 is opened. Moreover, also the insulating layer 52 on the upper surface of the contact portion 131 of the peripheral portion 100 is etched at the same time, and the pad material 51 of the contact portion 131 is exposed.

Figure 15:
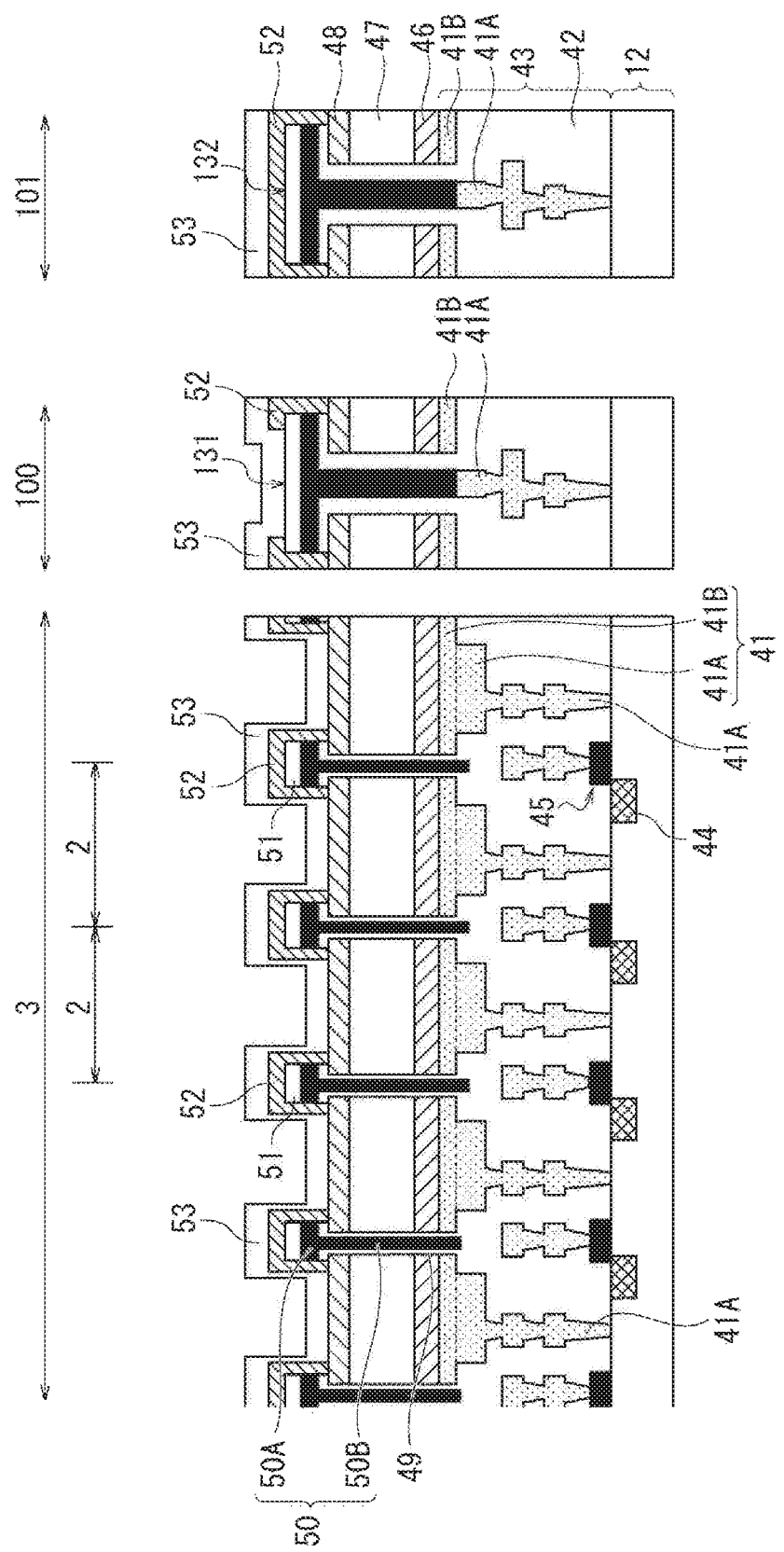
FIG. 15 is a diagram for explaining the method of producing the solid-state image sensor having the first cross-sectional structure.
Figure 16:
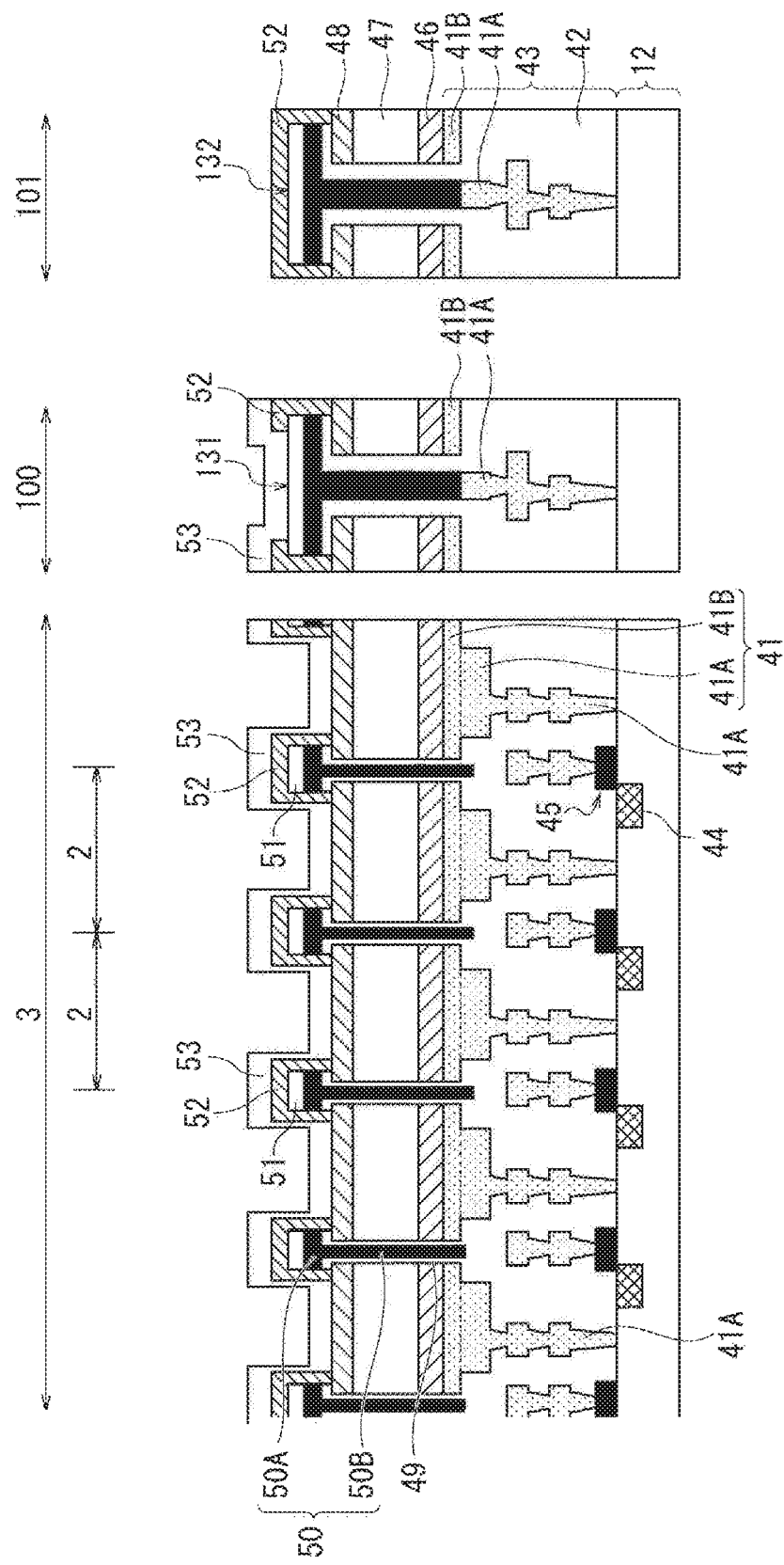
FIG. 16 is a diagram for explaining the method of producing the solid-state image sensor having the first cross-sectional structure.

Next, as shown in FIG. 15, the upper electrode layer 53 is conformally deposited on the entire upper surface. After that, as shown in FIG. 16, the upper electrode layer 53 of an unnecessary area such as the pad portion 101 is removed.

Figure 17:
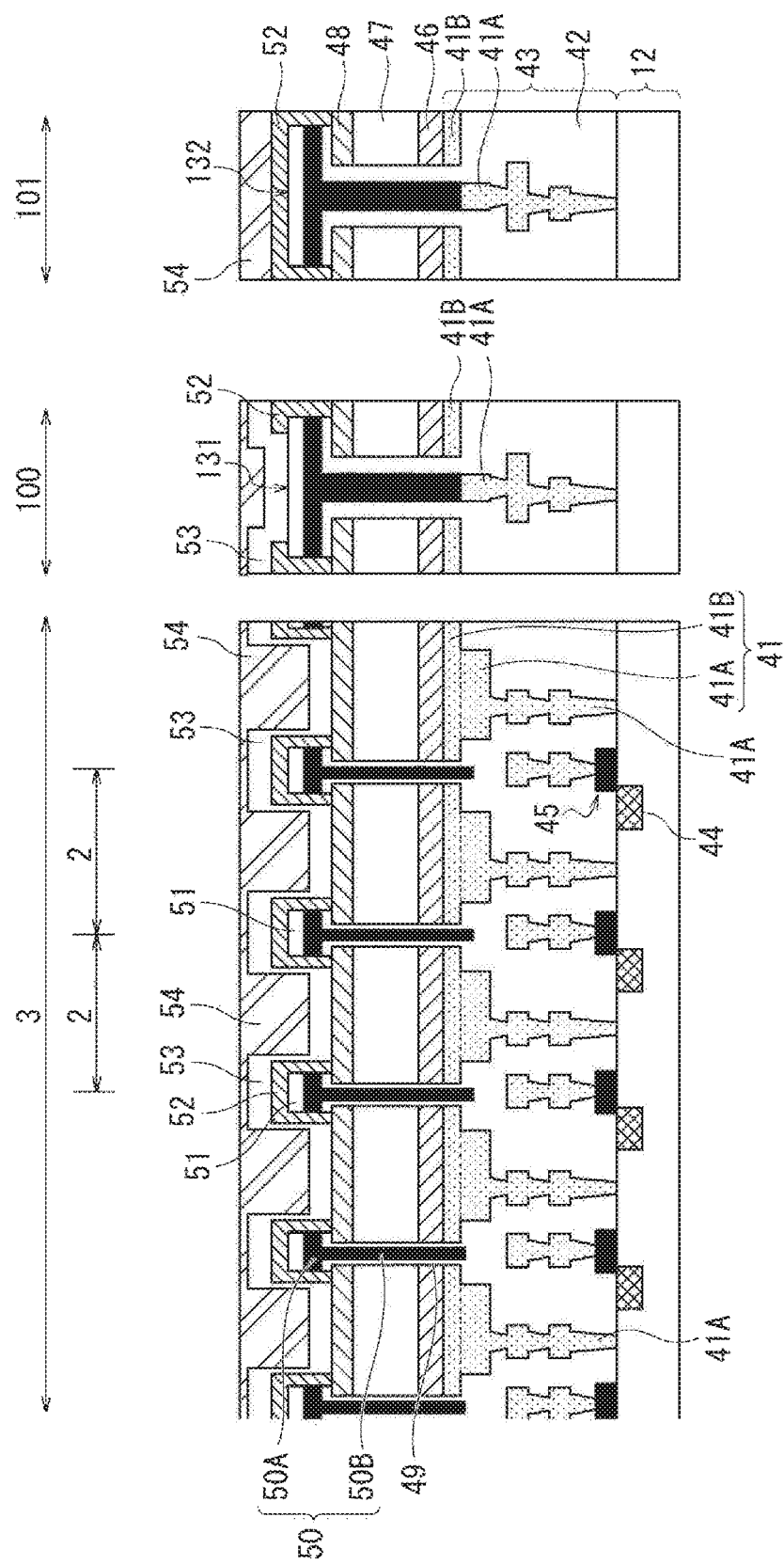
FIG. 17 is a diagram for explaining the method of producing the solid-state image sensor having the first cross-sectional structure.
Figure 18:
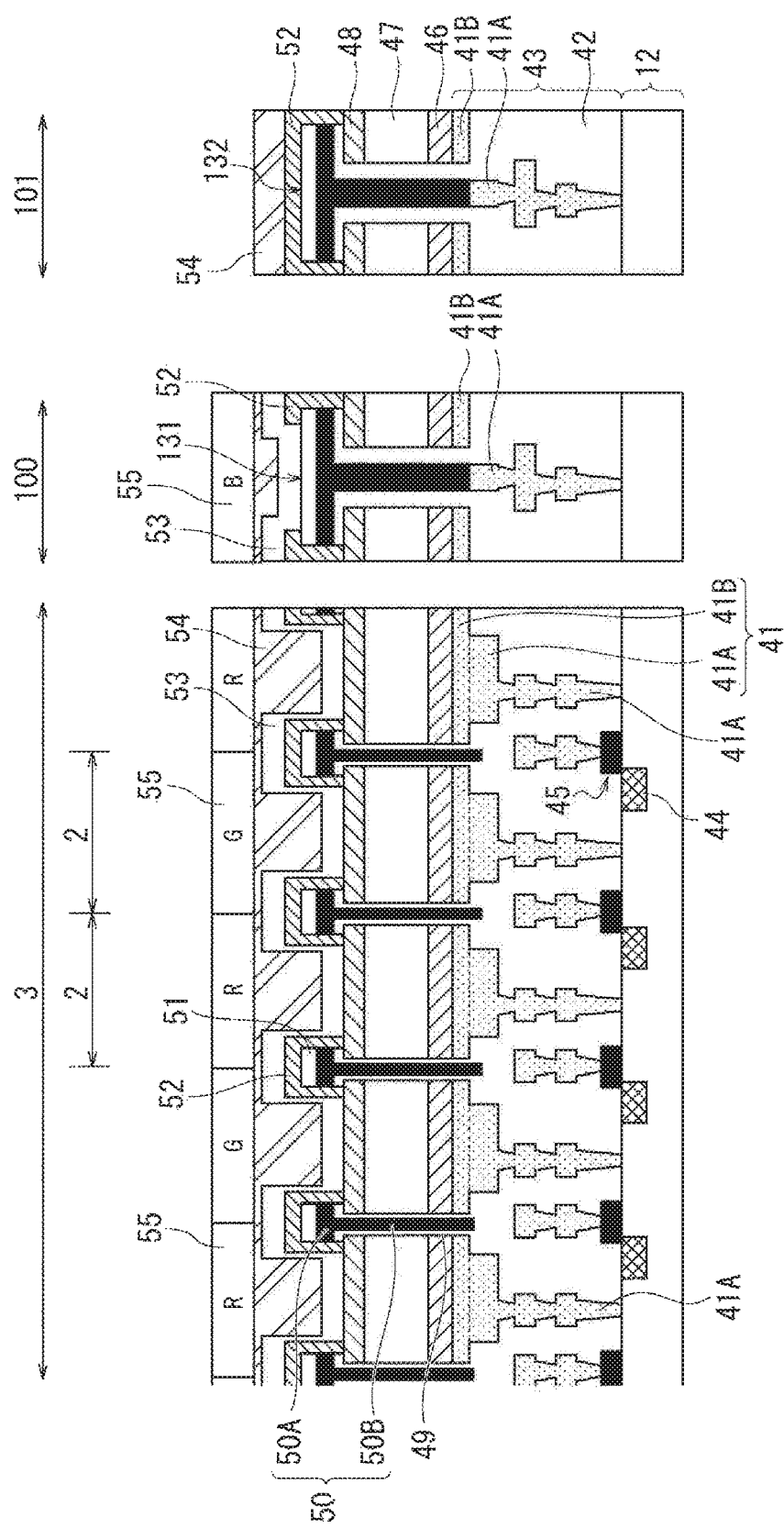
FIG. 18 is a diagram for explaining the method of producing the solid-state image sensor having the first cross-sectional structure.

Then, as shown in FIG. 17, the passivation film 54 including $SiO_2$, SiN, or the like is deposited on the upper surface of the upper electrode layer 53, and planarized. After that, as shown in FIG. 18, on the pixel array portion 3 and the upper surface of the passivation film 54 of the peripheral portion 100, the color filter 55 of R (red), G (green), or B (blue) is formed.

Figure 19:
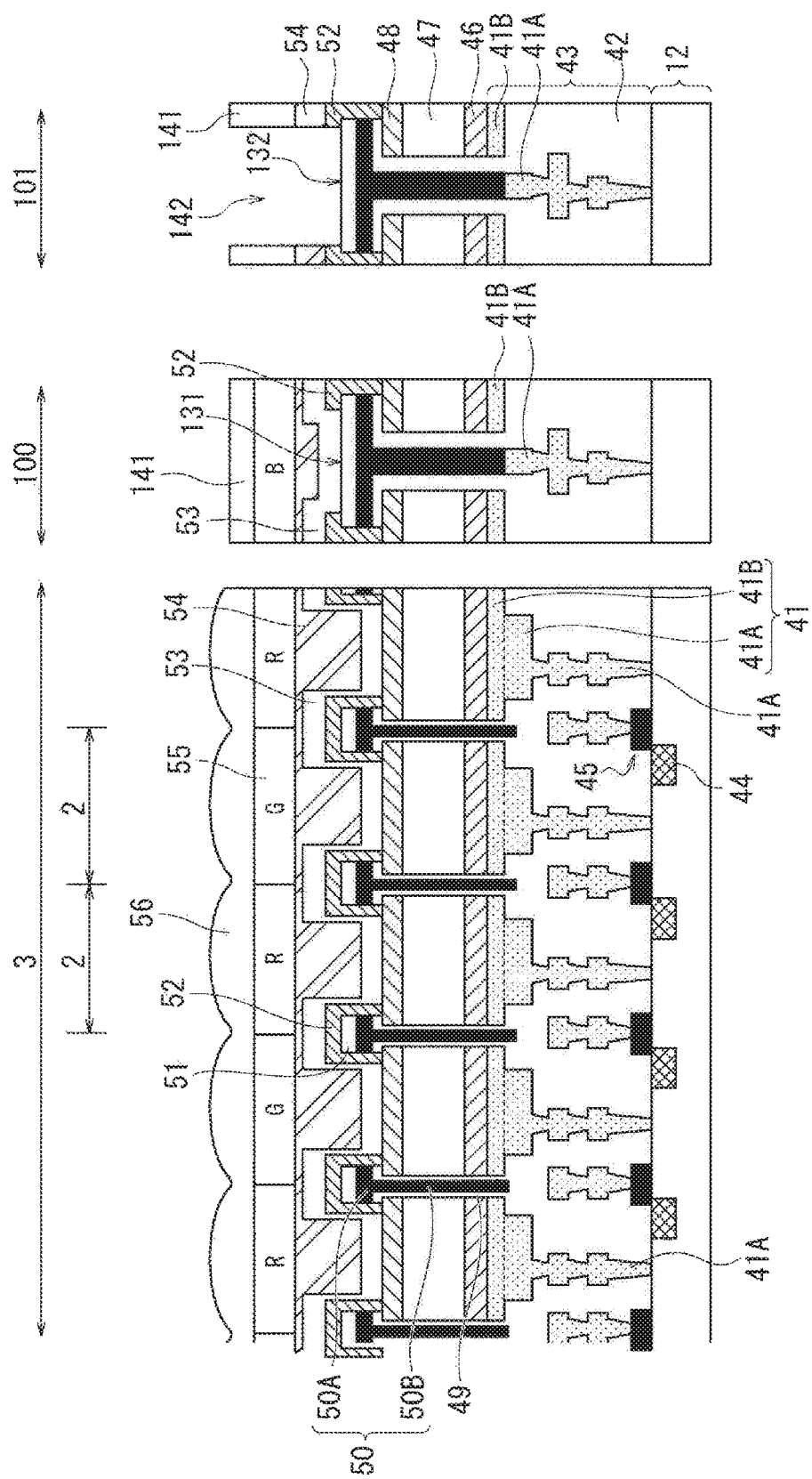
FIG. 19 is a diagram for explaining the method of producing the solid-state image sensor having the first cross-sectional structure.

Furthermore, as shown in FIG. 19, on the entire surface including the pixel array portion 3, the peripheral portion 100, and the pad portion 101, an on-chip lens material 141 is deposited. Then, by etching the on-chip lens material 141 in a lens shape, the on-chip lens 56 is formed in the pixel array portion 3. In the pad portion 101, the on-chip lens material 141, the passivation film 54, and the insulating layer 52 are etched so that the contact portion 132 is exposed, and an opening 142 is formed.

In this way, it is possible to produce the solid-state image sensor 1 having the pixel structure shown in FIG. 3.

(4. Second Cross-Sectional Structure of Pixel)

Figure 20:
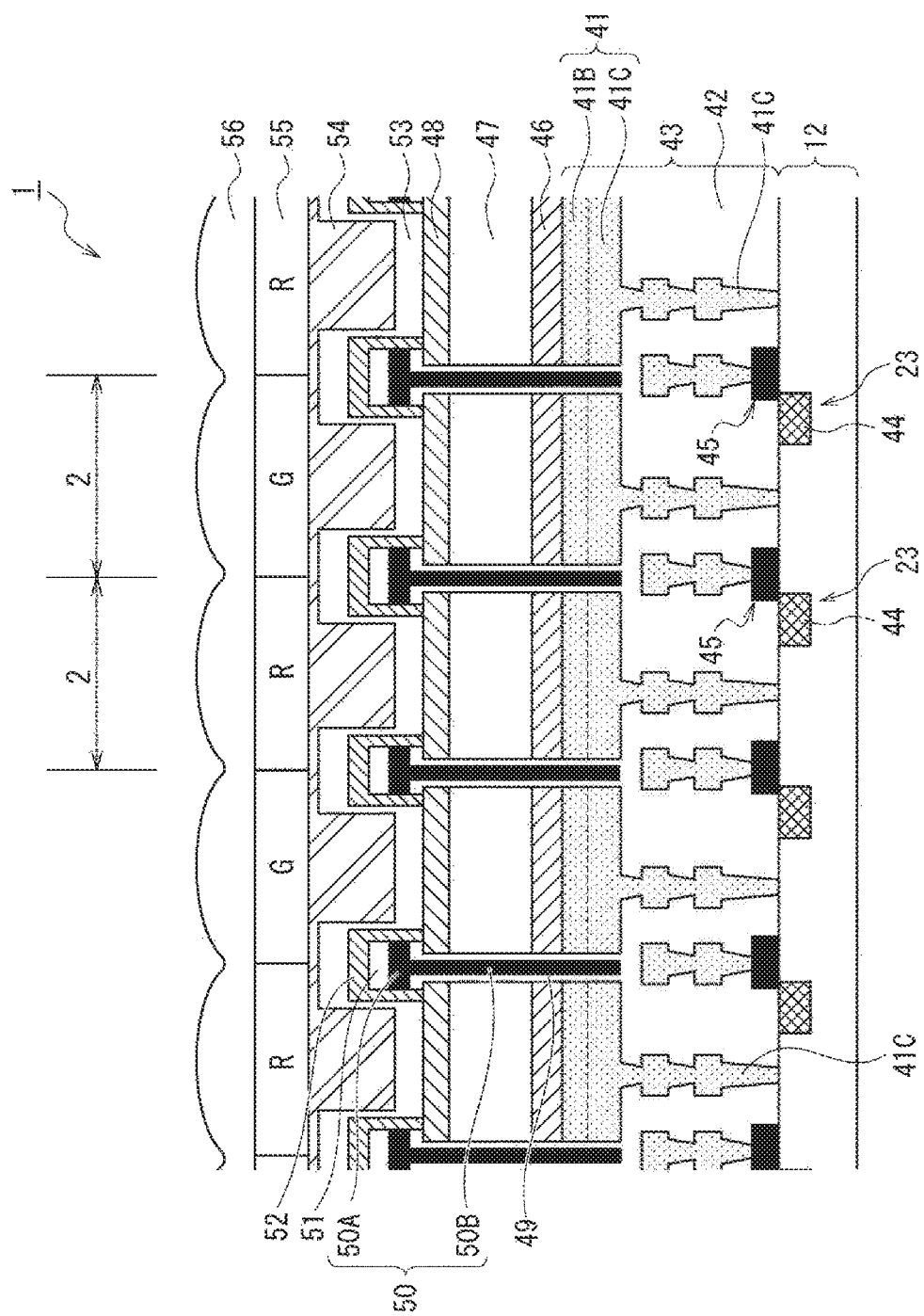
FIG. 20 is a diagram showing a second cross-sectional structure of a pixel.

FIG. 20 is a diagram showing a second cross-sectional structure of the pixel 2 of the solid-state image sensor 1.

In FIG. 20, the components corresponding to those of the first cross-sectional structure described above will be denoted by the same reference symbols, a description thereof will be simplified as appropriate, and different components from those of the first cross-sectional structure will be described.

Also in the second cross-sectional structure shown in FIG. 20, the plurality of wiring layers 41 being a part of the multilayered wiring layer 43 are configured by bonding lower wiring layers 41C on a side of the semiconductor substrate 12 and the upper side wiring layers 41B on a side of the photoelectric conversion layer 47 together.

In the second cross-sectional structure, the cross-sectional shape of the uppermost layer of the lower wiring layer 41C is different from the cross-sectional shape of the uppermost layer of the lower side wiring layers 41A having the first cross-sectional structure. Specifically, although the width of the wiring cross section of the uppermost layer of the lower side wiring layers 41A is shorter than the width of the upper side wiring layers 41B in the first cross-sectional structure shown in FIG. 3, the width of the wiring cross section of the uppermost layer of the lower wiring layer 41C is identical with the width of the upper side wiring layers 41B in the second cross-sectional structure.

(5. Method of Producing Pixel Having Second Cross-Sectional Structure)

With reference to FIGS. 21 to 24, a method of producing the solid-state image sensor 1 having the second cross-sectional structure will be described.

Figure 21:
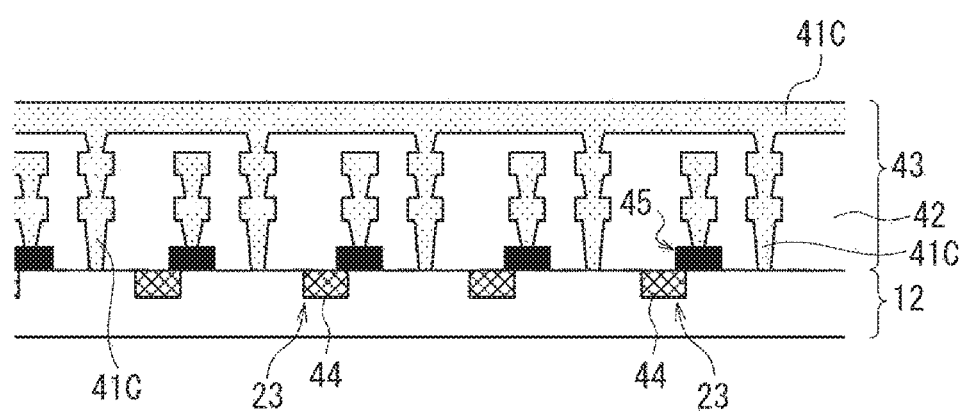
FIG. 21 is a diagram for explaining a method of producing a solid-state image sensor having the second cross-sectional structure.

First, as shown in FIG. 21, in the semiconductor substrate 12 having a p-type semiconductor area, for example, the N-type semiconductor area 44 is formed for each pixel 2 as the memory unit 23 and the multilayered wiring layer 43 is formed on the semiconductor substrate 12.

It should be noted that the multilayered wiring layer 43 formed in this process is a part of the lower wiring layer 41C and the interlayer insulating film 42 excluding the upper side wiring layers 41B on a side of the photoelectric conversion layer 47. In the first cross-sectional structure, as shown in FIG. 5A, the material of the lower side wiring layers 41A (e.g., copper) is patterned so that the wiring on the uppermost layer of the lower side wiring layers 41A is separated for each pixel. On the other hand, in the second cross-sectional structure, as shown in FIG. 21, the wiring on the uppermost layer of the lower wiring layer 41C is formed on the entire upper surface.

Figure 22A:
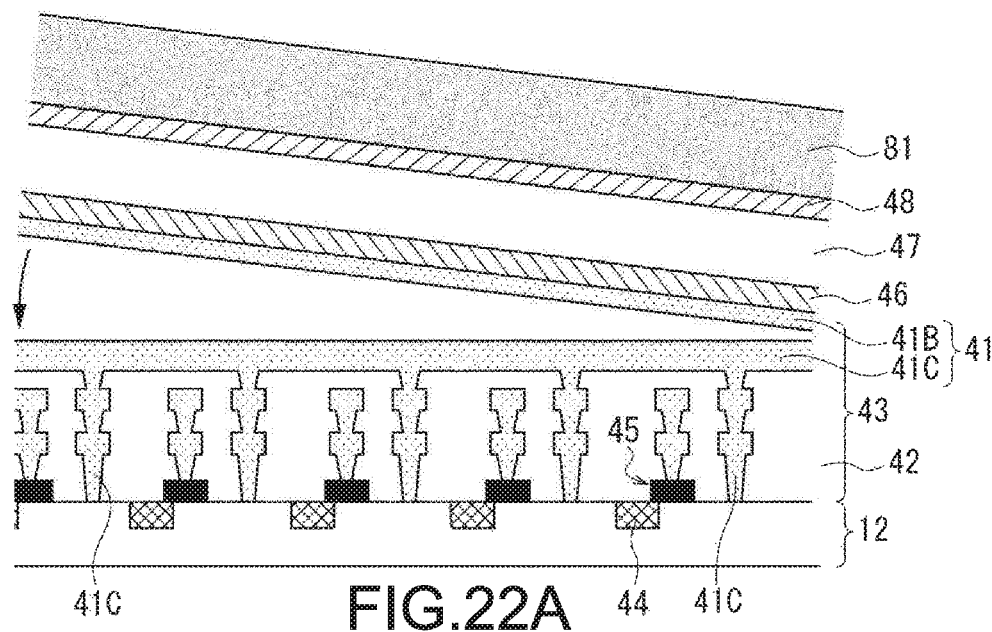
FIGS. 22A-22C are diagrams for explaining the method of producing the solid-state image sensor having the second cross-sectional structure.
Figure 22B:
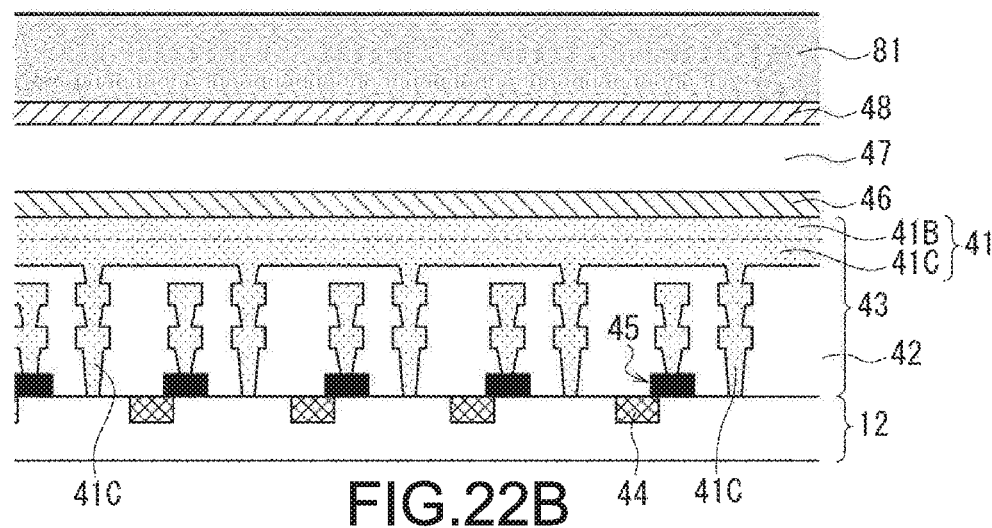

After that, as shown in FIG. 22A and FIG. 22B, the upper side wiring layers 41B of another substrate (supporting substrate 81) on which the buffer layer 48, the photoelectric conversion layer 47, the lower electrode layer 46, and the upper side wiring layers 41B are formed, and the lower wiring layer 41C of the semiconductor substrate 12 are bonded together.

Figure 22C:
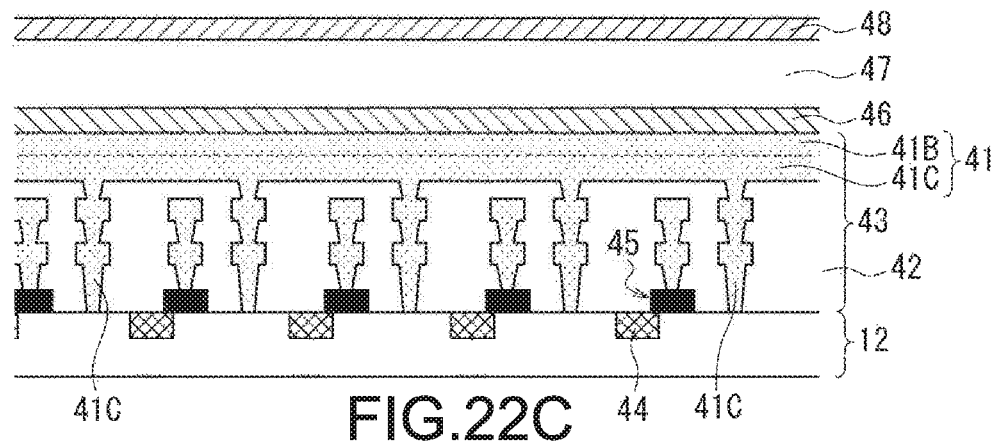

After that, as shown in FIG. 22C, the supporting substrate 81 is removed with polishing or a wetting process.

Figure 23:
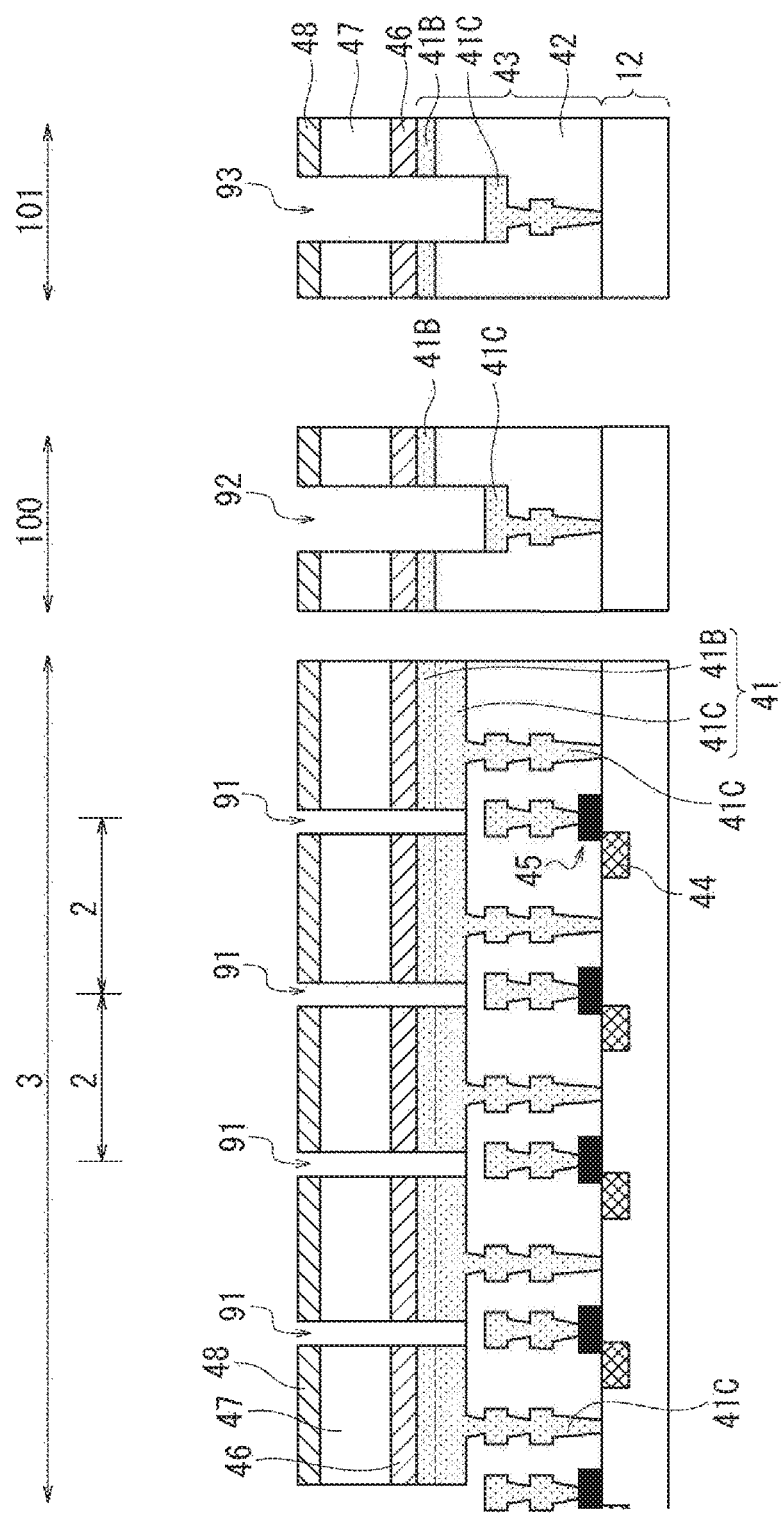
FIG. 23 is a diagram for explaining the method of producing the solid-state image sensor having the second cross-sectional structure.

Then, as shown in FIG. 23, the lower electrode layer 46, the photoelectric conversion layer 47, the buffer layer 48, and the upper side wiring layers 41B of the pixel boundary portion, and the uppermost layer of the lower wiring layer 41C are removed with a photolithography technique and a dry etching, thereby forming the opening 91. In this etching process, the upper side wiring layers 41B and the uppermost layer of the lower wiring layer 41C are removed at the same time, and thus, the upper side wiring layers 41B and the uppermost layer of the lower wiring layer 41C are processed to have the same width, as shown in FIG. 20.

Moreover, also in the peripheral portion 100 and the pad portion 101 which are on the outside of the pixel array portion 3, the lower electrode layer 46, the photoelectric conversion layer 47, the buffer layer 48, the upper side wiring layers 41B, and the uppermost layer of the lower wiring layer 41C are removed with a photolithography technique and a dry etching, thereby forming the opening 92 and the opening 93.

Figure 24:
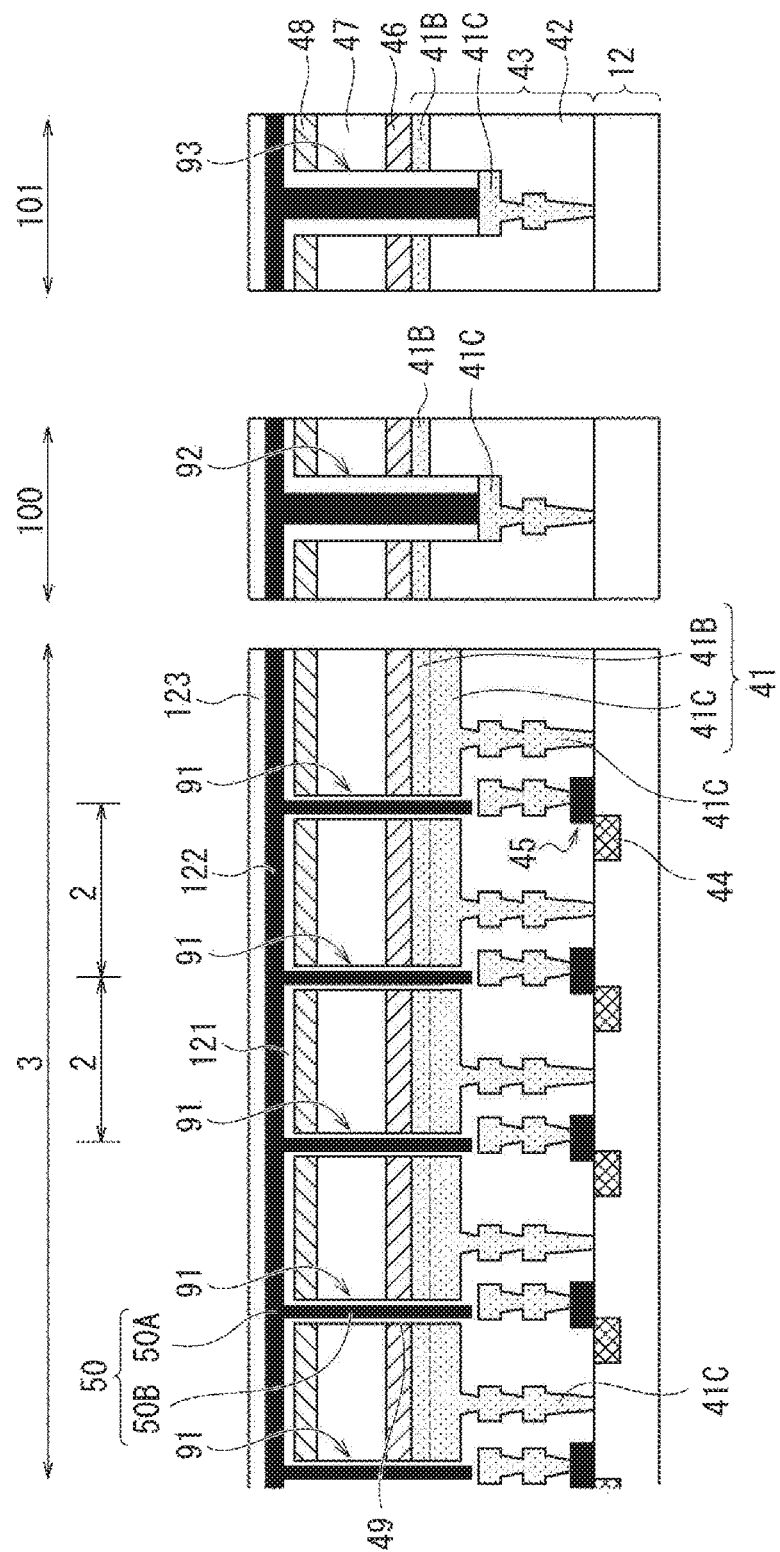
FIG. 24 is a diagram for explaining the method of producing the solid-state image sensor having the second cross-sectional structure.

Then, as shown in FIG. 24, on the openings 91 to 93 and the upper surface of the buffer layer 48, the insulating material 121, the light blocking material 122, and the pad material 123 are deposited. The subsequent processes are the same as those in the first production method described with reference to FIG. 12 to FIG. 19.

In this way, it is possible to produce the solid-state image sensor 1 having the pixel structure shown in FIG. 20.

As described above, it is possible to produce the solid-state image sensor 1 shown in FIG. 1 by forming the photoelectric conversion layer 47 or the lower electrode layer 46 and the upper side wiring layers 41B being a part of the plurality of wiring layers 41 on the supporting substrate 81 that is different from the semiconductor substrate 12, and bonding them to the semiconductor substrate 12 in which the plurality of pixel transistors 45 or the memory unit 23 is formed.

Therefore, because the photoelectric conversion layer 47 is formed on another substrate (supporting substrate 81), the deposition of the photoelectric conversion layer 47 is not limited by the temperature for ensuring the reliability of the plurality of wiring layers 41. Moreover, because of increase in the degree of freedom of the supporting substrate 81 being a base when the photoelectric conversion layer 47 is formed, it is possible to perform forming with improved photoelectric conversion properties. Accordingly, the photoelectric conversion layer 47 having sufficient photoelectric conversion properties can be formed, and also the reliability of the plurality of wiring layers 41 can be ensured. In addition, the degree of freedom of the buffer layer 48 is increased.

Moreover, on the supporting substrate 81 in which the photoelectric conversion layer 47 is formed, the upper side wiring layers 41B including the same material as the lower side wiring layers 41A (41C) is deposited as a material that is easy to bond to the lower side wiring layers 41A (41C) of the semiconductor substrate 12, and is bonded to a side of the semiconductor substrate 12 with a metal bond. Thus, it is possible to improve the reliability of the plurality of wiring layers 41.

It should be noted that in this embodiment, the upper side wiring layers 41B includes the same material (e.g., copper) as the lower side wiring layers 41A. However, the upper side wiring layers 41B does not necessarily need to include the same material as the lower side wiring layers 41A, and only needs to include a material that is easy to bond to the material of the lower side wiring layers 41A. For example, the material of the lower side wiring layers 41A is Al, and the material of the upper side wiring layers 41B is gold (Au).

Moreover, the material of the upper side wiring layers 41B may be metal that has a high conductivity and reacts with an insulating layer by heat treatment to produce a reaction product being an insulator, e.g., Ta or Ti.

An example of the case where a material that produces an insulator by heat treatment is used will be described with reference to FIG. 25 and FIG. 26.

Figure 25A:
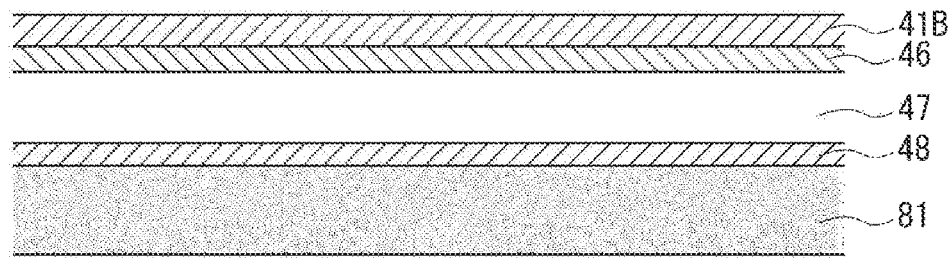
FIGS. 25A-25C are diagrams for explaining an example of another bonding method.

First, as shown in FIG. 25A, the buffer layer 48, the photoelectric conversion layer 47, the lower electrode layer 46, and the upper side wiring layers 41B are successively formed on the supporting substrate 81 that is prepared separately from the semiconductor substrate 12 with the processes described with reference to FIG. 5B to FIG. 5D. At this time, the upper side wiring layers 41B is formed by Ta, Ti, or the like described above.

Figure 25B:
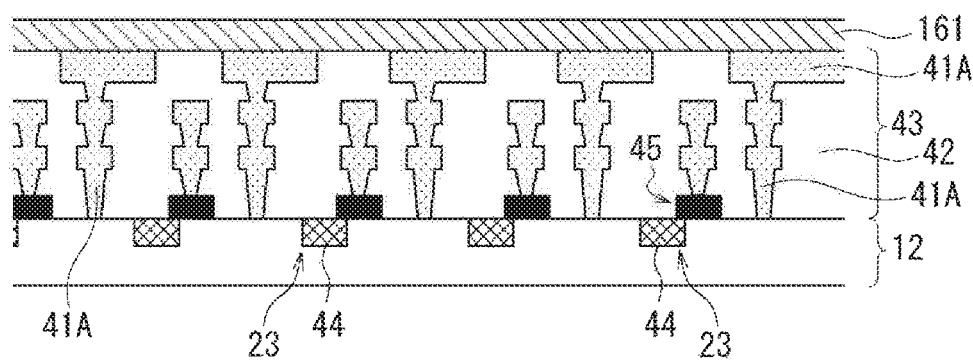

On the other hand, as shown in FIG. 25B, the semiconductor area 44 serving as the memory unit 23, the plurality of pixel transistors 45, the lower side wiring layers 41A, and the interlayer insulating film 42 are formed on a side of the semiconductor substrate 12 with the process described with reference to FIG. 5A. Then, on the uppermost layer, a metal film 161 that has a high conductivity and reacts with an insulating layer by heat treatment to produce a reaction product being an insulator is formed. The metal film 161 includes Ta, Ti, or the like described above, and a part of the metal film 161 becomes the lower side wiring layers 41A after bonding.

The metal film 161 is formed to have such a thickness that the entire portion of the metal film 161, which is in contact with the interlayer insulating film 42, becomes a reaction product. In other words, the metal film 161 is formed to have such a thickness that a conductive layer does not remain on the surface of the portion that is in contact with the interlayer insulating film 42 after the heat treatment. A remaining conductor on the surface is a cause of increase in short-circuiting between adjacent electrodes or current leakage. Therefore, although it differs depending on the combination of materials or heat treatment conditions, if the thickness of the metal film 161 is not more than 100 nm, the entire reaction to the surface is possible. In addition, if the film thickness is not more than 20 nm, it is possible to favorably express the above-mentioned properties. Moreover, the metal film 161 is formed to have such a thickness that a reaction product with the interlayer insulating film 42 has sufficient barrier properties, e.g., not less than 5 molecular layer thickness.

Figure 25C:
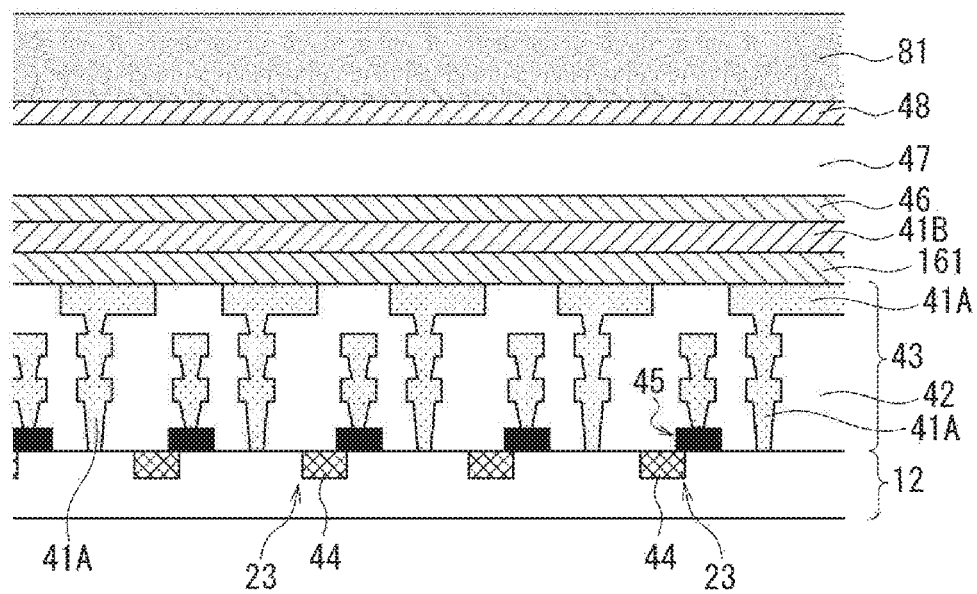

Then, as shown in FIG. 25C, the supporting substrate 81 in which the photoelectric conversion layer 47 and the like are deposited is inverted, and the metal film 161 and the upper side wiring layers 41B are brought into contact with each other so as to face to each other and are subject to heat treatment, thereby bonding the metal film 161 and the upper side wiring layers 41B together.

Figure 26:
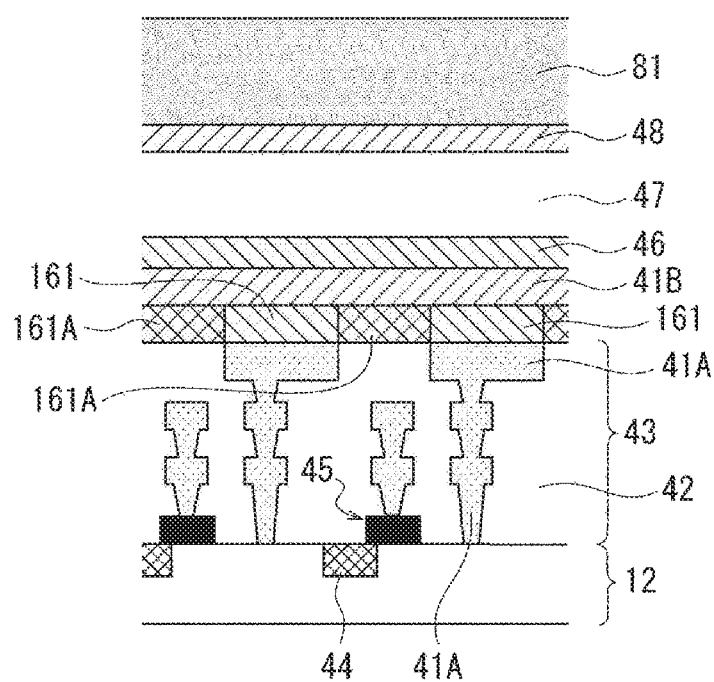
FIG. 26 is a diagram for explaining an example of another bonding method.

As shown in FIG. 26, a part of the metal film 161 becomes an insulating film 161A by heat applied during the bonding. Specifically, a reaction is caused in a part of the metal film 161, which is in contact with the interlayer insulating film 42, by the heat applied during the bonding, and thus, the insulating film 161A being a reaction product of the metal film 161 and the interlayer insulating film 42 is formed. On the other hand, the metal film 161 formed on the lower side wiring layers 41A does not change after the heat treatment, and maintains the state of being deposited.

For example, in the case where the interlayer insulating film 42 includes $SiO_2$ and the metal film 161 includes Ti, a metal oxide layer including $TiO_2$ is formed on the interlayer insulating film 42 as the insulating film 161A with the above-mentioned reaction. The $TiO_2$ has high barrier properties, as used as barrier metal, and has high insulating properties.

After the bonding described above, the lower electrode layer 46, the photoelectric conversion layer 47, the buffer layer 48, and the like are pixel-separated together with the upper side wiring layers 41B, as described with reference to FIG. 7.

The upper side wiring layers 41B may include the same or different material as/from the metal film 161. For example, one of the upper side wiring layers 41B and the metal film 161 includes Ta and the other includes Ti. Moreover, the upper side wiring layers 41B may have a laminated structure of Ta or Ti and another metal material such as Ti/Cu and Ta/Cu.

(6. Application Example to Electronic Apparatus)

The techniques of the present disclosure are not limited to the application to a solid-state image sensor. Specifically, the techniques of the present disclosure are applicable to a general electronic apparatus that uses a solid-state image sensor for an image capturing unit (photoelectric conversion unit), e.g., an imaging apparatus such as a digital still camera and a video camera, a portable terminal apparatus having an imaging function, and a copier that uses a solid-state image sensor for an image reading unit. The solid-state image sensor may be formed of a one chip, or may be a module having an imaging function in which an imaging unit and a signal processing unit or an optical system are collectively packaged.

Figure 27:
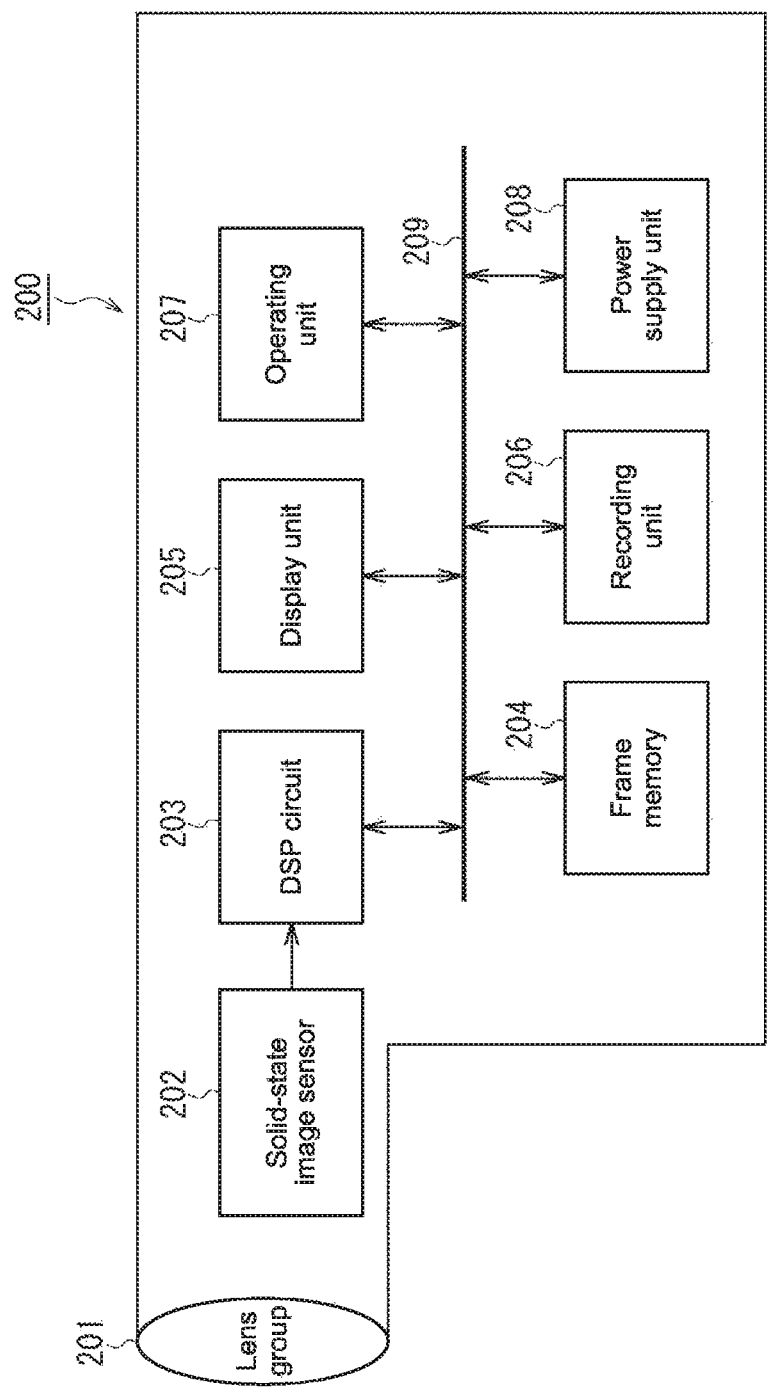
FIG. 27 is a block diagram showing a configuration example of an imaging apparatus serving as an electronic apparatus according to an embodiment of the present disclosure.

FIG. 27 is a block diagram showing a configuration example of an imaging apparatus serving as an electronic apparatus according to an embodiment of the present disclosure.

An imaging apparatus 200 shown in FIG. 27 includes an optical unit 201 formed of a lens group or the like, a solid-state image sensor (imaging device) 202 that has the configuration of the solid-state image sensor 1 shown in FIG. 1, and a digital signal processor (DSP) circuit 203 being a camera signal processing circuit. Moreover, the imaging apparatus 200 includes a frame memory 204, a display unit 205, a recording unit 206, an operating unit 207, and a power supply unit 208. The DSP circuit 203, the frame memory 204, the display unit 205, the recording unit 206, the operating unit 207, and the power supply unit 208 are connected to each other via a bus line 209.

The optical unit 201 is configured to capture incident light (image light) from a subject and to form an image on an imaging surface of the solid-state image sensor 202. The solid-state image sensor 202 is configured to convert the amount of incident light formed on the imaging surface by the optical unit 201 into an electric signal on a pixel-by-pixel basis and to output it as a pixel signal. As the solid-state image sensor 202, the solid-state image sensor 1 shown in FIG. 1, i.e., a solid-state image sensor having improved reliability of the plurality of wiring layers 41 and the photoelectric conversion layer 47 can be used.

The display unit 205 is formed of, for example, a panel display apparatus such as a liquid crystal panel and an organic electro luminescence (EL) panel, and is configured to display a moving image or a still image captured by the solid-state image sensor 202. The recording unit 206 is configured to record the moving image or still image captured by the solid-state image sensor 202 in a recording medium such as a hard disk and a semiconductor memory.

The operating unit 207 is configured to issue an operation command related to various functions of the imaging apparatus 200 under a user's operation. The power supply unit 208 supplies various power supplies being operational power supplies of the DSP circuit 203, the frame memory 204, the display unit 205, the recording unit 206, and the operating unit 207 to the supply targets.

As described above, by using the solid-state image sensor 1 having the first or second pixel structure as the solid-state image sensor 202, it is possible to improve the reliability of the plurality of wiring layers 41 and the photoelectric conversion layer 47. Therefore, also in the imaging apparatus 200 such as a camera module for a mobile apparatus, e.g., a video camera, a digital still camera, and a mobile phone, it is possible to increase the quality of the captured image.

In the above-mentioned example, a solid-state image sensor that uses an electron as a signal charge has been described with the first conductive type being P-type and the second conductive type being N-type. However, the techniques of the present disclosure can be applied to also a solid-state image sensor that uses an electron hole as a signal charge. Specifically, it is possible to constitute the above-mentioned semiconductor areas by reverse conductive-type semiconductor areas with the first conductive type being N-type and the second conductive type being P-type.

Moreover, in the above-mentioned example, the solid-state image sensor 1 has been described as a front-surface irradiation-type solid-state image sensor. However, the pixel structure and production method of the present disclosure can be applied also to a rear-surface irradiation-type solid-state image sensor.

Moreover, the techniques of the present disclosure are not limited to the application to a solid-state image sensor that detects distribution of the amount of visible incident light and captures an image of the distribution, and can be applied to a solid-state imaging sensor, which captures the distribution of the incident amount of infrared rays, X-rays, particles, or the like as an image, and a general solid-state imaging sensor (physical amount distribution detection apparatus) in a broad sense, such as a fingerprint detection sensor, which detects distribution of another physical amount, e.g., pressure and capacitance, and captures it as an image.

Embodiments of the present disclosure are not limited to the above-mentioned embodiments and various modifications can be made without departing from the gist of the present disclosure.

For example, an embodiment obtained by combining all or a part of the plurality of embodiments described above may be adopted.

It should be noted that the effects described in the specification are given for exemplary purposes and are not limited. Effects other than those described in the specification may be given.

It should be noted that the present disclosure may also take the following configurations.

(1) A solid-state image sensor, including
a pixel formed, upon forming a structure where a photoelectric conversion layer is laminated on a wiring layer constituting a pixel circuit, by forming at least the photoelectric conversion layer and a wiring layer bonding layer on a different substrate from a semiconductor substrate in which the wiring layer is formed, and by bonding the wiring layer bonding film of the different substrate and the wiring layer of the semiconductor substrate together.

(2) The solid-state image sensor according to (1) above, in which
a section width of a bonding surface of the wiring layer that is bonded to the wiring layer bonding film is different from that of the wiring layer bonding film.

(3) The solid-state image sensor according to (2) above, in which
the section width of the bonding surface of the wiring layer that is bonded to the wiring layer bonding film is shorter than that of the wiring layer bonding film.

(4) The solid-state image sensor according to (1) above, in which
a section width of a bonding surface of the wiring layer that is bonded to the wiring layer bonding film is equal to that of the wiring layer bonding film.

(5) The solid-state image sensor according to (1) above, in which
a thickness of a bonding surface of the wiring layer that is bonded to the wiring layer bonding film is larger than that of the wiring layer bonding film.

(6) The solid-state image sensor according to any one of (1) to (5) above, in which
the photoelectric conversion layer and the wiring layer bonding film are separated from each other for each pixel by removing the photoelectric conversion layer and the wiring layer bonding film on a pixel boundary portion after the bonding.

(7) The solid-state image sensor according to (5) above, in which
the pixel boundary portion that separates the photoelectric conversion layer and the wiring layer bonding film from each other for each pixel includes a light blocking material embedded therein.

(8) The solid-state image sensor according to any one of (1) to (7) above, in which
a material of the wiring layer is copper and also a material of the wiring layer bonding film is copper.

(9) The solid-state image sensor according to any one of (1) to (7) above, in which
the wiring layer bonding film includes metal that reacts with an insulating layer by heat treatment to produce a reaction product being an insulator.

(10) The solid-state image sensor according to any one of (1) to (7) above, in which
the wiring layer of the semiconductor substrate, which is bonded to the wiring layer bonding film of the different substrate includes metal that reacts with an insulating layer by heat treatment to produce a reaction product being an insulator.

(11) The solid-state image sensor according to any one of (1) to (7) above, in which
a material of the wiring layer of the semiconductor substrate, which is bonded to the wiring layer bonding film of the different substrate, and a material of the wiring layer bonding film are one of tantalum and titanium.

(12) The solid-state image sensor according to any one of (1) to (11) above, in which
the pixel includes a memory unit configured to temporarily hold charges stored in an exposure time period until the charges are read, the exposure time period being common to all pixels.

(13) The solid-state image sensor according to any one of (1) to (12) above, in which
the image sensor is a front-surface irradiation image sensor in which light is incident from a side of a surface of the semiconductor substrate in which the wiring layer and the photoelectric conversion layer are formed.

(14) A method of producing a solid-state image sensor, including:
forming, upon forming a structure where a photoelectric conversion layer is laminated on a wiring layer constituting a pixel circuit, at least the photoelectric conversion layer and a wiring layer bonding layer on a different substrate from a semiconductor substrate in which the wiring layer is formed; and
bonding the wiring layer bonding film of the different substrate and the wiring layer of the semiconductor substrate together.

(15) The method of producing a solid-state image sensor according to (14) above, further including
removing the photoelectric conversion layer and the wiring layer bonding film on a pixel boundary portion after bonding the wiring layer bonding film of the different substrate and the wiring layer of the semiconductor substrate together.

(16) The method of producing a solid-state image sensor according to (15) above, further including
embedding a light blocking material into the pixel boundary portion from which the photoelectric conversion layer and the wiring layer bonding film are removed.

17. An electronic apparatus, including
a solid-state image sensor including a pixel formed, upon forming a structure where a photoelectric conversion layer is laminated on a wiring layer constituting a pixel circuit, by forming at least the photoelectric conversion layer and a wiring layer bonding layer on a different substrate from a semiconductor substrate in which the wiring layer is formed, and by bonding the wiring layer bonding film of the different substrate and the wiring layer of the semiconductor substrate together.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image sensor, comprising,
a pixel formed, upon forming a structure where a photoelectric conversion layer is laminated on a wiring layer constituting a pixel circuit, by forming at least the photoelectric conversion layer and a wiring layer bonding film on a different substrate from a semiconductor substrate in which the wiring layer is formed, and by bonding the wiring layer bonding film of the different substrate and the wiring layer of the semiconductor substrate together,
wherein the photoelectric conversion layer and the wiring layer bonding film are separated from each other for each pixel by removing the photoelectric conversion layer and the wiring layer bonding film on a pixel boundary portion after the bonding.

2. The solid-state image sensor according to claim 1, wherein
a section width of a bonding surface of the wiring layer that is bonded to the wiring layer bonding film is different from that of the wiring layer bonding film.

3. The solid-state image sensor according to claim 2, wherein
the section width of the bonding surface of the wiring layer that is bonded to the wiring layer bonding film is shorter than that of the wiring layer bonding film.

4. The solid-state image sensor according to claim 1, wherein
a section width of a bonding surface of the wiring layer that is bonded to the wiring layer bonding film is equal to that of the wiring layer bonding film.

5. The solid-state image sensor according to claim 1, wherein
a thickness of a bonding surface of the wiring layer that is bonded to the wiring layer bonding film is larger than that of the wiring layer bonding film.

6. The solid-state image sensor according to claim 1, wherein
the pixel boundary portion that separates the photoelectric conversion layer and the wiring layer bonding film from each other for each pixel includes a light blocking material embedded therein.

7. The solid-state image sensor according to claim 1, wherein
a material of the wiring layer is copper and also a material of the wiring layer bonding film is copper.

8. The solid-state image sensor according to claim 1, wherein
the wiring layer bonding film includes metal that reacts with an insulating layer by heat treatment to produce a reaction product being an insulator.

9. The solid-state image sensor according to claim 1, wherein
the wiring layer of the semiconductor substrate, which is bonded to the wiring layer bonding film of the different substrate includes metal that reacts with an insulating layer by heat treatment to produce a reaction product being an insulator.

10. The solid-state image sensor according to claim 1, wherein
a material of the wiring layer of the semiconductor substrate, which is bonded to the wiring layer bonding film of the different substrate, and a material of the wiring layer bonding film are one of tantalum and titanium.

11. The solid-state image sensor according to claim 1, wherein
the pixel includes a memory unit configured to temporarily hold charges stored in an exposure time period until the charges are read, the exposure time period being common to all pixels.

12. The solid-state image sensor according to claim 1, wherein
the image sensor is a front-surface irradiation image sensor in which light is incident from a side of a surface of the semiconductor substrate in which the wiring layer and the photoelectric conversion layer are formed.

13. An electronic apparatus, comprising,
a solid-state image sensor including a pixel formed, upon forming a structure where a photoelectric conversion layer is laminated on a wiring layer constituting a pixel circuit, by forming at least the photoelectric conversion layer and a wiring layer bonding film on a different substrate from a semiconductor substrate in which the wiring layer is formed, and by bonding the wiring layer bonding film of the different substrate and the wiring layer of the semiconductor substrate together,
wherein the photoelectric conversion layer and the wiring layer bonding film are separated from each other for each pixel by removing the photoelectric conversion layer and the wiring layer bonding film on a pixel boundary portion after the bonding.

14. The electronic apparatus according to claim 13, wherein
the pixel boundary portion that separates the photoelectric conversion layer and the wiring layer bonding film from each other for each pixel includes a light blocking material embedded therein.

15. The electronic apparatus according to claim 13, wherein
a section width of a bonding surface of the wiring layer that is bonded to the wiring layer bonding film is different from that of the wiring layer bonding film.

16. The electronic apparatus according to claim 15, wherein the section width of the bonding surface of the wiring layer that is bonded to the wiring layer bonding film is shorter than that of the wiring layer bonding film.

17. The electronic apparatus according to claim 13, wherein
a section width of a bonding surface of the wiring layer that is bonded to the wiring layer bonding film is equal to that of the wiring layer bonding film.

18. The electronic apparatus according to claim 13, wherein
a thickness of a bonding surface of the wiring layer that is bonded to the wiring layer bonding film is larger than that of the wiring layer bonding film.

* * * * *